United States Patent
Kanamori et al.

(10) Patent No.: US 10,535,540 B2
(45) Date of Patent: Jan. 14, 2020

(54) SUBSTRATE STORING CONTAINER

(71) Applicant: MIRAIAL Co., Ltd, Tokyo (JP)

(72) Inventors: Yuta Kanamori, Tokyo (JP); Chiaki Matsutori, Tokyo (JP); Minoru Tomita, Tokyo (JP); Kazunori Ozawa, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 9 days.

(21) Appl. No.: 15/508,354

(22) PCT Filed: Feb. 27, 2015

(86) PCT No.: PCT/JP2015/055817
§ 371 (c)(1),
(2) Date: Mar. 2, 2017

(87) PCT Pub. No.: WO2016/047163
PCT Pub. Date: Mar. 31, 2016

(65) Prior Publication Data
US 2017/0287758 A1    Oct. 5, 2017

(30) Foreign Application Priority Data

Sep. 26, 2014 (WO) .................. PCT/JP2014/075734

(51) Int. Cl.
*H01L 21/00* (2006.01)
*H01L 21/673* (2006.01)

(52) U.S. Cl.
CPC .. *H01L 21/67326* (2013.01); *H01L 21/67366* (2013.01); *H01L 21/67383* (2013.01)

(58) Field of Classification Search
CPC ....... B65D 85/48; H01L 21/67; H01L 21/673; H01L 21/67326; H01L 21/67366; H01L 21/67383

(Continued)

(56) References Cited

U.S. PATENT DOCUMENTS 4,874,654 A * 10/1989 Funaki ............... B29C 45/16
                                                    296/84.1
5,154,301 A * 10/1992 Kos ................. H01L 21/67326
                                                    118/500

(Continued)

FOREIGN PATENT DOCUMENTS

CN     101588906 A     11/2009
JP     H10-070185       3/1998

(Continued)

OTHER PUBLICATIONS

Notification of Reasons for Refusal issued to JP Patent Application No. 2016-549965, dated Sep. 4, 2018. 2 Pages.

(Continued)

*Primary Examiner* — Ernesto A Grano
(74) *Attorney, Agent, or Firm* — Muncy, Geissler, Olds & Lowe, P.C.

(57) ABSTRACT

A substrate storing container includes a container main body, a lid body, and a lateral substrate support portion. The lateral substrate support portion of the substrate storing container includes substrate contact portions touching a substrate when supporting an edge portion of the substrate, and contact portion support portions supporting the substrate contact portions. The substrate contact portions are made of a material having a heat-resisting property with respect to temperature of the substrate touching the substrate contact portions. The contact portion support portions are made of a material having a lower heat-resisting property than that of the substrate contact portions and having a lower coefficient of moisture absorption than that of the substrate contact portions.

10 Claims, 26 Drawing Sheets

(58) Field of Classification Search
USPC .................................. 206/710, 711, 712, 723
See application file for complete search history.

(56) References Cited

U.S. PATENT DOCUMENTS

| | | | | |
|---|---|---|---|---|
| 5,370,142 | A * | 12/1994 | Nishi | H01L 21/67057 118/500 |
| 5,492,229 | A * | 2/1996 | Tanaka | C30B 31/14 206/454 |
| 5,577,621 | A | 11/1996 | Yi | |
| 5,584,401 | A * | 12/1996 | Yoshida | H01L 21/6734 118/500 |
| 5,725,101 | A * | 3/1998 | Kakizaki | B65D 25/107 206/454 |
| 5,788,082 | A | 8/1998 | Nyseth | |
| 5,816,410 | A * | 10/1998 | Nyseth | H01L 21/67369 206/711 |
| 5,890,598 | A * | 4/1999 | Hayashida | H01L 21/6734 206/454 |
| 6,039,186 | A * | 3/2000 | Bhatt | H01L 21/6732 206/454 |
| 6,428,729 | B1 | 8/2002 | Bhatt et al. | |
| 6,682,797 | B1 | 1/2004 | Otoi et al. | |
| 8,292,081 | B2 * | 10/2012 | Sasaki | H01L 21/67376 206/710 |
| 8,318,275 | B2 * | 11/2012 | Kudo | B29C 45/1657 206/454 |
| 8,365,919 | B2 * | 2/2013 | Nakayama | H01L 21/67369 206/711 |
| 9,865,487 | B2 * | 1/2018 | Oyama | H01L 21/67379 |
| 2001/0045174 | A1 * | 11/2001 | Horn | H01L 21/67326 104/134 |
| 2003/0025244 | A1 * | 2/2003 | Bhatt | G03F 7/70691 264/254 |
| 2004/0226845 | A1 * | 11/2004 | Raj | B65G 49/062 206/454 |
| 2005/0247594 | A1 * | 11/2005 | Mimura | H01L 21/67369 206/710 |
| 2005/0274645 | A1 * | 12/2005 | Hasegawa | H01L 21/67369 206/710 |
| 2006/0213796 | A1 * | 9/2006 | Kominami | H01L 21/67369 206/454 |
| 2006/0283774 | A1 | 12/2006 | Hasegawa et al. | |
| 2011/0064896 | A1 | 3/2011 | Kudo et al. | |
| 2012/0103860 | A1 | 5/2012 | Masuko et al. | |
| 2014/0138279 | A1 * | 5/2014 | Nagashima | B65D 43/02 206/525 |

FOREIGN PATENT DOCUMENTS

| | | |
|---|---|---|
| JP | H11-074337 A | 3/1999 |
| JP | 2006-324327 | 11/2006 |
| JP | 2008-140948 | 6/2008 |
| JP | 4150465 | 9/2008 |
| JP | 2011-018771 | 1/2011 |
| JP | 2014-513442 A | 5/2014 |
| WO | WO 2011/102318 | 8/2011 |
| WO | WO2012/151431 A2 | 8/2012 |
| WO | WO2012/151431 A3 | 8/2012 |
| WO | WO 2013/151022 | 10/2013 |
| WO | WO 2014/069810 | 5/2014 |

OTHER PUBLICATIONS

Chinese National Intellectual Property Administration, Office Action, dated Jan. 28, 2019, 6 pages.

* cited by examiner

SUBSTRATE STORING CONTAINER

TECHNICAL FIELD

The present invention relates to a substrate storing container used when a substrate including a semiconductor wafer, etc. is stored, preserved, transported, and conveyed.

BACKGROUND ART

A container having a configuration including a container main body and a lid body has been conventionally known as a substrate storing container for storing and transporting a substrate including a semiconductor wafer.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates. The lid body can be removably attached to the container main body opening portion and can close the container main body opening portion.

In addition, in the substrate storing space, a substrate support plate-like portion is provided at the wall portion so as to form a pair in the substrate storing space. When the container main body opening portion is not closed by the lid body, the substrate support plate-like portion can support edge portions of a plurality of substrates in a state in which adjacent substrates are arranged in parallel to be spaced by a predetermined interval.

A front retainer is provided to a part of the lid body at a portion which faces a substrate storing space when the container main body opening portion is closed. When the container main body opening portion is closed by the lid body, the front retainer can support edge portions of the plurality of substrates. In addition, the back side substrate support portion is provided at the wall portion so as to form a pair with the front retainer. The back side substrate support portion can support edge portions of a plurality of substrates. When the container main body opening portion is closed by the lid body, the back side substrate support portion retains a plurality of substrates in a state in which adjacent substrates are arranged in parallel to be spaced apart by a predetermined interval, by supporting the plurality of substrates in cooperation with the front retainer.

Patent Document 1: PCT International Publication No. WO2011/102318
Patent Document 2: Japanese Patent No. 4150465
Patent Document 3: PCT International Publication No. WO2014/069810

DISCLOSURE OF THE INVENTION

Problems to be Solved by the Invention

For example, a high-temperature substrate is stored in a substrate storing container for transporting a substrate in a process in a factory. When a substrate support plate-like portion of the substrate storing container does not have a heat-resisting property, scratches may be generated on a portion of the substrate support plate-like portion touching the substrate, that is, a substrate contact portion, or resin included in the substrate contact portion melts. Thus, there is a concern that a back surface of the substrate may be damaged when the substrate is loaded or unloaded relative to the substrate storing space. In addition, there is a concern about damage to the substrate due to contact with a substrate ejector when a dimension of the substrate storing container changes due to heat strain and deviates from a standard substrate height, etc. For this reason, the substrate storing container requires the heat-resisting property.

Meanwhile, when the substrate storing container is made of a material having the heat-resisting property, and when the substrate storing space is purged with nitrogen, etc., water is released from a contact portion support portion that supports the substrate storing container or the substrate contact portion due to a decrease in humidity of the substrate storing space. For this reason, humidity inside the substrate storing space purged with nitrogen, etc. rises over time even in a state in which the container main body opening portion is closed by the lid body. The rise in humidity inside the substrate storing space may adversely affect the substrate.

An object of the invention is to provide a substrate storing container having a heat-resisting property and a low hygroscopic property.

Means for Solving the Problems

The invention relates to a substrate storing container including a container main body in which a substrate storing space capable of storing a plurality of substrates is formed therein, and a container main body opening portion in communication with the substrate storing space is formed at one end portion, a lid body removably attached to the container main body opening portion, the lid body removably capable of closing the container main body opening portion, and a lateral substrate support portion disposed to form a pair in the substrate storing space, the lateral substrate support portion being capable of supporting edge portions of the plurality of substrates in a state in which adjacent substrates among the plurality of substrates are arranged in parallel to be spaced by a predetermined interval when the container main body opening portion is closed by the lid body, wherein the lateral substrate support portion includes a substrate contact portion that touches the substrates when the edge portions of the substrates are supported, and a contact portion support portion that supports the substrate contact portion, the substrate contact portion is made of a material having a heat-resisting property with respect to temperature of the substrates touching the substrate contact portion, and the contact portion support portion is made of a material having a lower heat-resisting property than the heat-resisting property of the substrate contact portion and having a lower coefficient of moisture absorption than a coefficient of moisture absorption of the substrate contact portion.

In addition, the substrate contact portion is preferably formed to be separated from the contact portion support portion and fixed to the contact portion support portion.

In addition, preferably, the container main body has a pair of side walls, at least a pair of lateral substrate support portions is provided, one of the lateral substrate support portions is fixed to one of the side walls, and the other one of the lateral substrate support portions is fixed to the other one of the side walls, the one of the lateral substrate support portions is allowed to be fixed to the other one of the side walls, and the other one of the lateral substrate support portions is allowed to be fixed to the one of the side walls, and the substrate contact portion of the one of the lateral substrate support portions is allowed to be fixed to the contact portion support portion of the other one of the lateral substrate support portions, and the substrate contact portion of the other one of the lateral substrate support portions is allowed to be fixed to the contact portion support portion of the one of the lateral substrate support portions.

In addition, preferably, the contact portion support portion has a locking portion, a wide hole portion and a narrow hole portion in communication with the wide hole portion are formed in the locking portion, the substrate contact portion includes a main body of the substrate contact portion and a locked portion locked in the locking portion, the main body of the substrate contact portion is not insertable into the wide hole portion and the narrow hole portion, the locked portion includes a head portion insertable into the wide hole portion and not insertable into the narrow hole portion, and a neck portion insertable into the wide hole portion and the narrow hole portion, one end portion of the neck portion being connected to the head portion, the other end portion of the neck portion being connected to the main body of the substrate contact portion, and a locked portion movement inhibiting portion is included to inhibit the neck portion from moving from the narrow hole portion to the wide hole portion when the neck portion is inserted into the narrow hole portion.

In addition, preferably, a plurality of locking portions and a plurality of locked portions are included, a width of the narrow hole portion is substantially equal to a width of the neck portion in a direction orthogonal to a direction in which the narrow hole portion and the wide hole portion are connected to each other in one of the narrow hole portions, and a width of the narrow hole portion is larger than a width of the neck portion in the direction orthogonal to the direction in which the narrow hole portion and the wide hole portion are connected to each other in another one of the narrow hole portions.

Herein, when the width of the narrow hole portion is completely equal to the width of the neck portion rather than being substantially equal thereto, the neck portion may not be inserted into the narrow hole portion. Thus, "the width of the narrow hole portion is substantially equal to the width of the neck portion" means that the width of the narrow hole portion is equal to the width of the neck portion to an extent at which such a defect is solved, and the neck portion is insertable into the narrow hole portion.

In addition, the substrate contact portion is preferably fixed to the contact portion support portion using insert molding. In addition, the substrate contact portion is preferably formed by overmolding with respect to the contact portion support portion.

In addition, the container main body is preferably made of a material having a lower coefficient of moisture absorption than a coefficient of moisture absorption of the substrate contact portion. In addition, the container main body is molded integrally with the contact portion support portion.

Effects of the Invention

According to the invention, it is possible to provide a substrate storing container having a heat-resisting property and a low hygroscopic property.

PREFERRED MODE FOR CARRYING OUT THE INVENTION

Hereinafter, a description will be given of a substrate storing container according to a first embodiment of the invention with reference to FIG. 1 to FIG. 6C.

Figure 1:
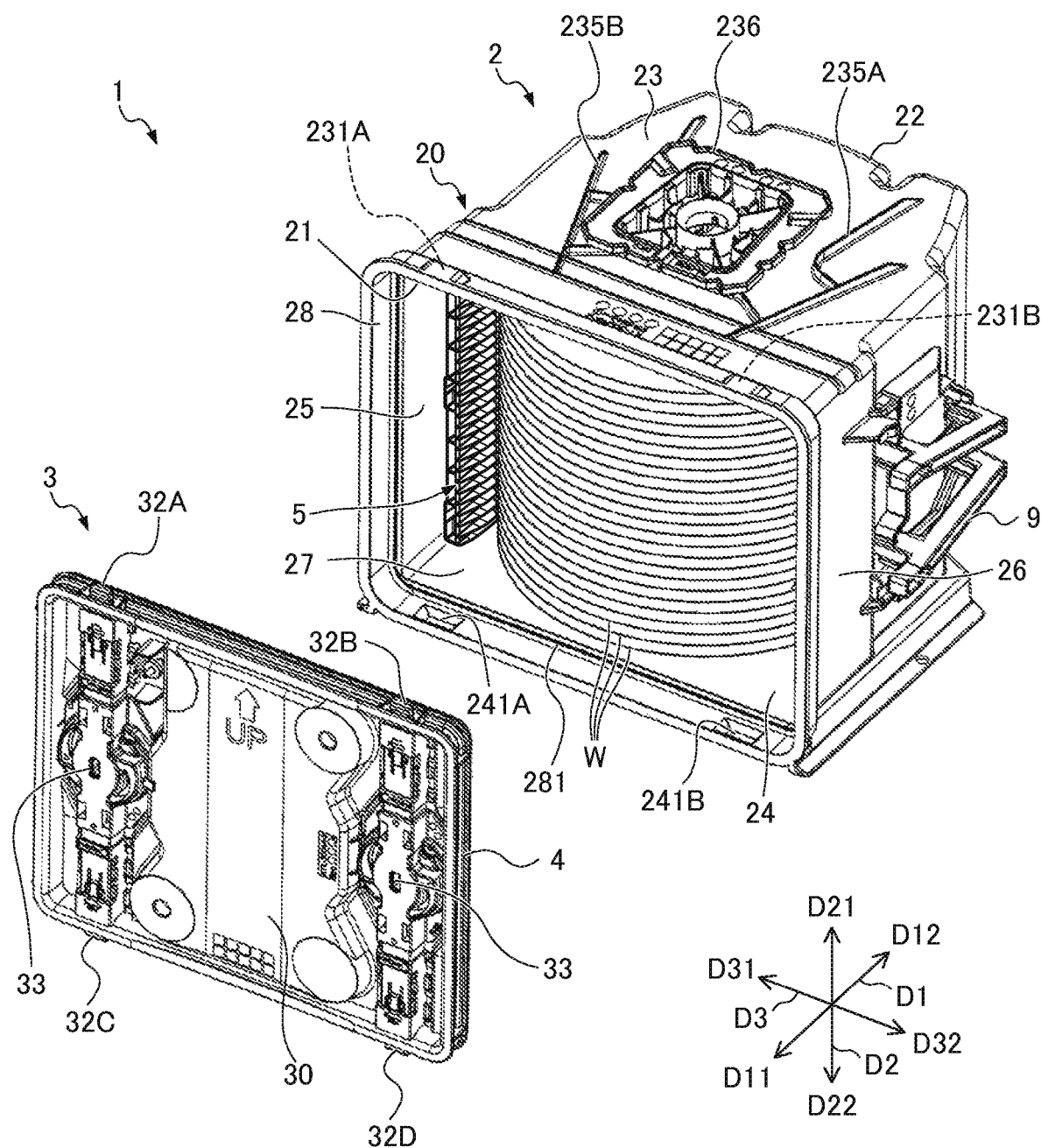
FIG. 1 is an exploded perspective view illustrating a state in which a substrate W is stored in a substrate storing container 1 according to a first embodiment of the invention.
Figure 2:
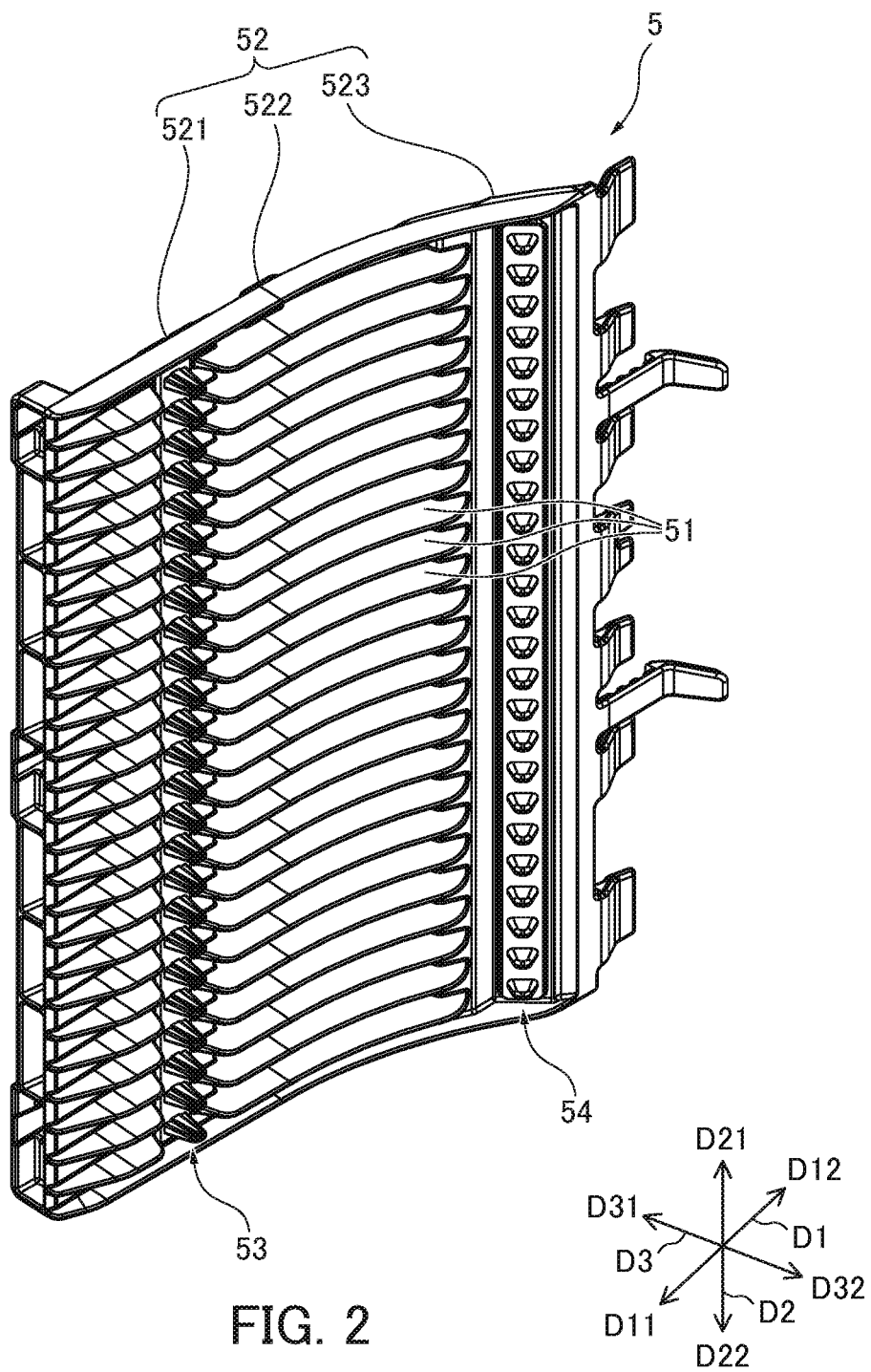
FIG. 2 is a perspective view illustrating a substrate support plate-like portion 5 of the substrate storing container 1 according to a first embodiment of the invention.
Figure 3:
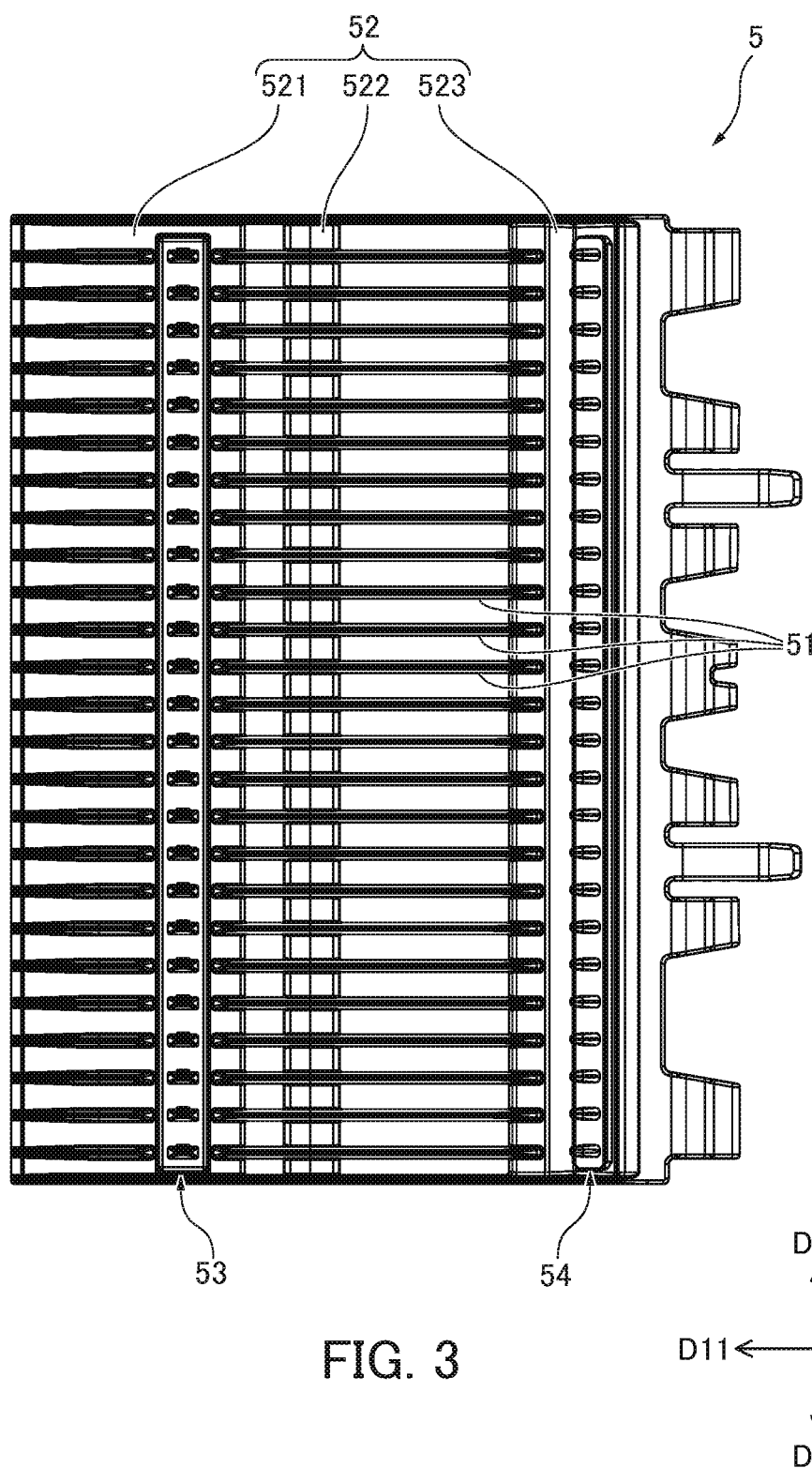
FIG. 3 is a front view illustrating the substrate support plate-like portion 5 of the substrate storing container 1 according to the first embodiment of the invention.
Figure 4:
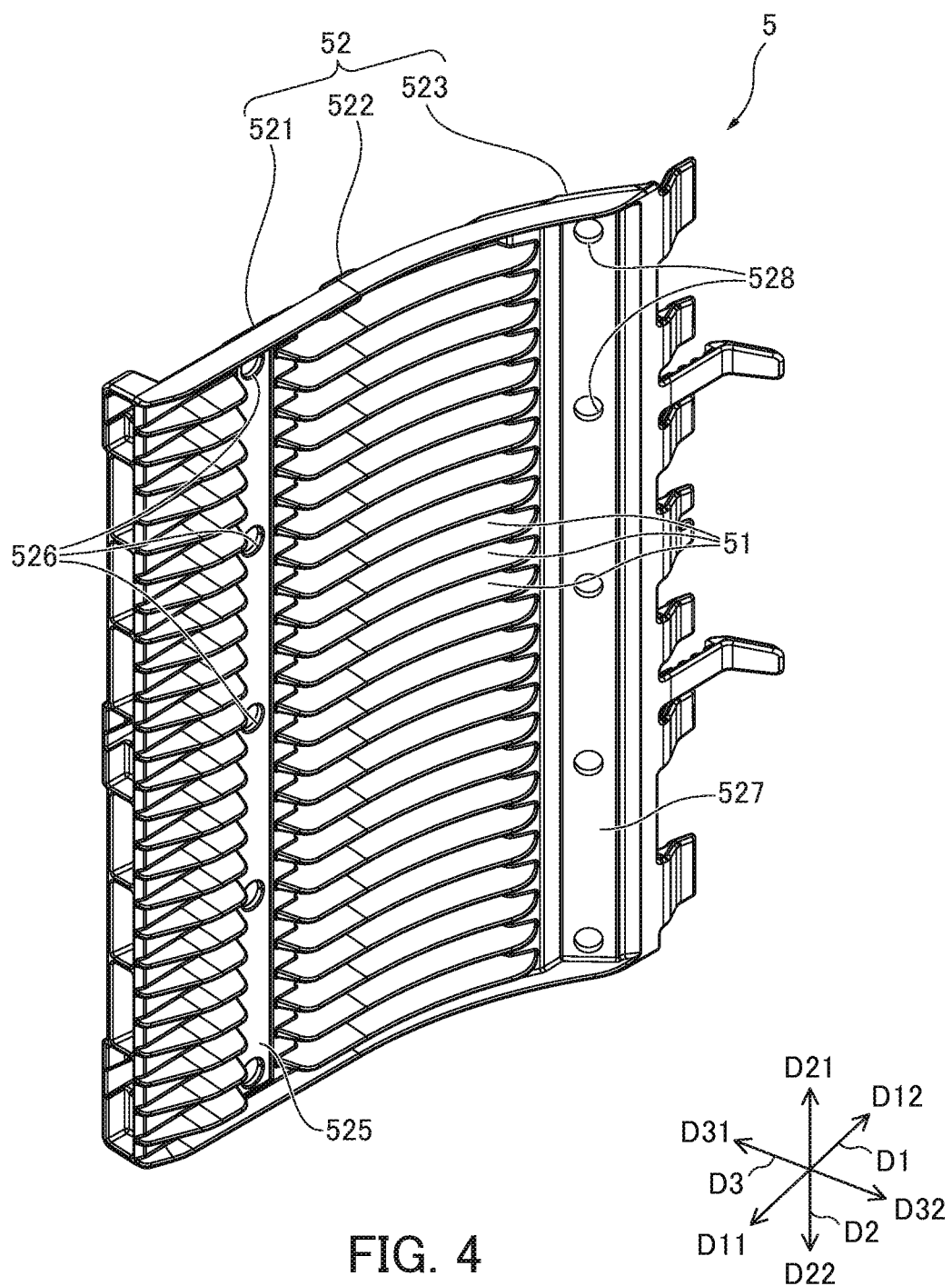
FIG. 4 is a perspective view illustrating a state in which a front side substrate contact portion 53 and a back side substrate contact portion 54 are removed from the substrate support plate-like portion 5 of the substrate storing container 1 according to the first embodiment of the invention.
Figure 5A:
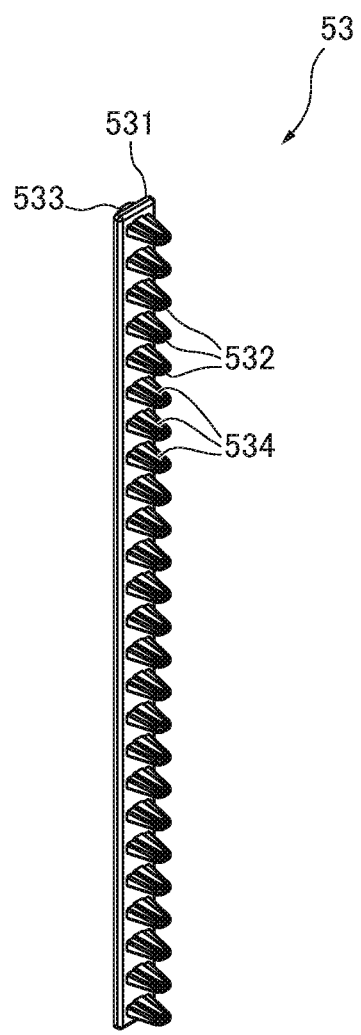
FIG. 5A is a perspective view illustrating the front side substrate contact portion 53 of the substrate storing container 1 according to the first embodiment of the invention.
Figure 5B:
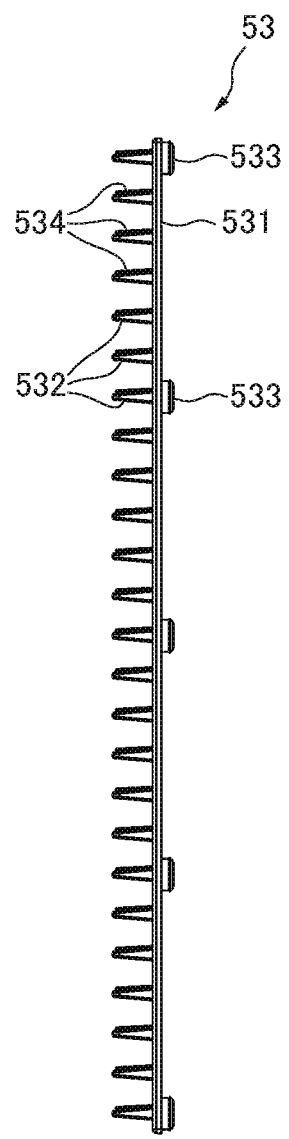
FIG. 5B is a side view illustrating the front side substrate contact portion 53 of the substrate storing container 1 according to the first embodiment of the invention.

FIG. 1 is an exploded perspective view illustrating a state in which a substrate W is stored in a substrate storing container 1 according to a first embodiment of the invention. FIG. 2 is a perspective view illustrating a substrate support plate-like portion 5 of the substrate storing container 1 according to the first embodiment of the invention. FIG. 3 is a front view illustrating the substrate support plate-like portion 5 of the substrate storing container 1 according to the first embodiment of the invention. FIG. 4 is a perspective view illustrating a state in which a front side substrate contact portion 53 and a back side substrate contact portion 54 are removed from the substrate support plate-like portion 5 of the substrate storing container 1 according to the first embodiment of the invention. FIG. 5A is a perspective view illustrating the front side substrate contact portion 53 of the substrate storing container 1 according to the first embodiment of the invention. FIG. 5B is a side view illustrating the front side substrate contact portion 53 of the substrate storing container 1 according to the first embodiment of the invention.

Figure 5C:
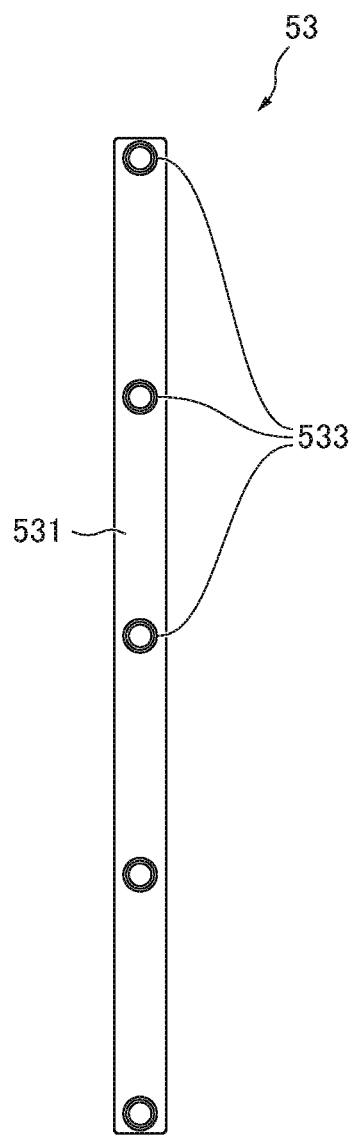
FIG. 5C is a rear view illustrating the front side substrate contact portion 53 of the substrate storing container 1 according to the first embodiment of the invention.
Figure 6A:
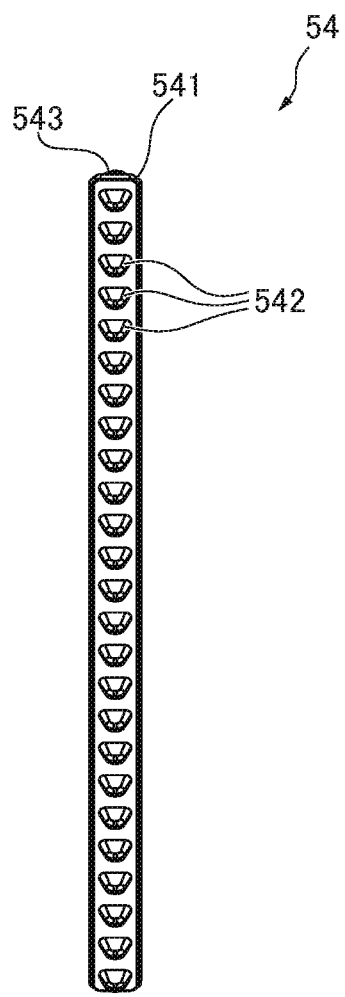
FIG. 6A is a perspective view illustrating the back side substrate contact portion 54 of the substrate storing container 1 according to the first embodiment of the invention.
Figure 6B:
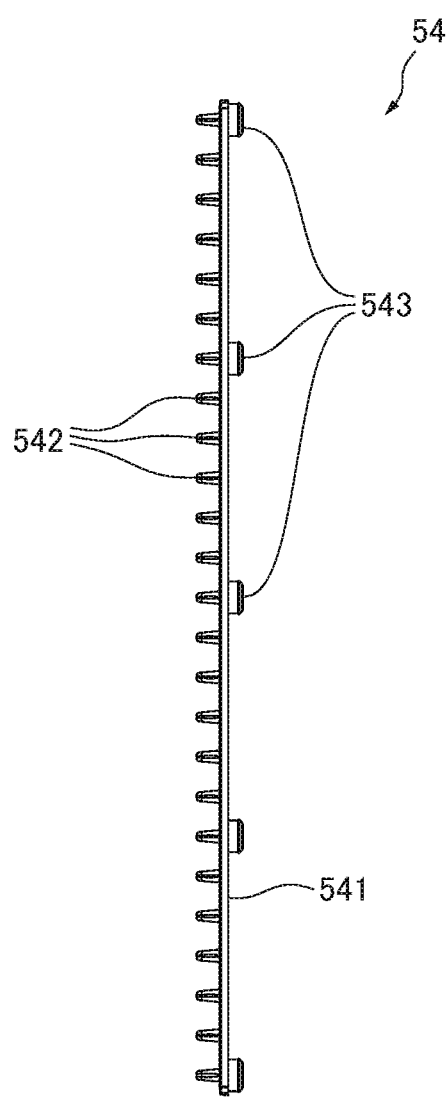
FIG. 6B is a side view illustrating the back side substrate contact portion 54 of the substrate storing container 1 according to the first embodiment of the invention.
Figure 6C:
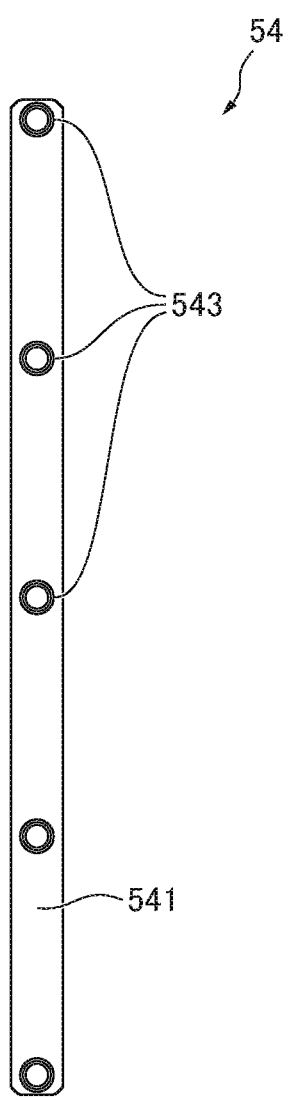
FIG. 6C is a rear view illustrating the back side substrate contact portion 54 of the substrate storing container 1 according to the first embodiment of the invention.

FIG. 5C is a rear view illustrating the front side substrate contact portion 53 of the substrate storing container 1 according to the first embodiment of the invention. FIG. 6A is a perspective view illustrating the back side substrate contact portion 54 of the substrate storing container 1 according to the first embodiment of the invention. FIG. 6B is a side view illustrating the back side substrate contact portion 54 of the substrate storing container 1 according to the first embodiment of the invention. FIG. 6C is a rear view illustrating the back side substrate contact portion 54 of the substrate storing container 1 according to the first embodiment of the invention.

Herein, for the purpose of illustration, the direction from a container main body 2 toward a lid body 3 (described later) (direction from the upper right toward the lower left in FIG. 1) is defined as a forward direction D11 and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are defined as an upper/lower direction D2. Moreover, the direction from a second side wall 26 to a first side wall 25 (described later) (direction from the lower right toward the upper left in FIG. 1) is defined as a left direction D31 and the direction opposite to the direction D31 is defined as a right direction D32. Furthermore, these directions are defined as a left/right direction D3. In the main figures, arrows indicating these directions will be assigned for description.

Furthermore, the substrate W (refer to FIG. 1, etc.) stored in the substrate storing container 1 is a disk-like silicon wafer, glass wafer, sapphire wafer, etc., and is a thin member used for industrial use. The substrate W in the present embodiment is a silicon wafer having a diameter of about 300 mm.

As illustrated in FIG. 1, the substrate storing container 1 includes the container main body 2, the lid body 3, a sealing member 4, a substrate support plate-like portion 5 serving as a lateral substrate support portion, a back side substrate support portion (not illustrated), and a front retainer (not illustrated).

The container main body 2 has a tubular wall portion 20 with a container main body opening portion 21 formed at one end portion and with the other end portion closed. A substrate storing space 27 is formed in the container main body 2. The substrate storing space 27 is formed to be surrounded by the wall portion 20. The substrate support plate-like portion 5 is disposed at a part that is a portion of the wall portion 20 and forms the substrate storing space 27. A plurality of substrates W can be stored in the substrate storing space 27 as illustrated in FIG. 1.

The substrate support plate-like portion 5 is provided at the wall portion 20 so as to form a pair in the substrate storing space 27. When the container main body opening portion 21 is not closed by the lid body 3, the substrate support plate-like portion 5 can support edge portions of the plurality of substrates W in a state in which adjacent substrates W are arranged in parallel to be spaced apart by a predetermined interval by abutting the edge portions of the plurality of substrates W. The back side substrate support portion (not illustrated) is provided on a back side of the substrate support plate-like portion 5.

The back side substrate support portion (not illustrated) is provided at the wall portion 20 so as to form a pair with the front retainer (not illustrated) in the substrate storing space 27. When the container main body opening portion 21 is closed by the lid body 3, the back side substrate support portion (not illustrated) can support rear portions of the edge portions of the plurality of substrates W by abutting the edge portions of the plurality of substrates W.

The lid body 3 can be removably attached to an opening circumferential portion 28 (FIG. 1, etc.) forming the container main body opening portion 21 and can close the container main body opening portion 21. The front retainer (not illustrated) is a part of the lid body 3 and is provided at a portion that faces the substrate storing space 27 when the container main body opening portion 21 is closed by the lid body 3. The front retainer (not illustrated) is provided so as to form a pair with the back side substrate support portion (not illustrated) in the substrate storing space 27.

When the container main body opening portion 21 is closed by the lid body 3, the front retainer (not illustrated) can support front portions of the edge portions of the plurality of substrates W by abutting the edge portions of the plurality of substrates W. When the container main body opening portion 21 is closed by the lid body 3, the front retainer (not illustrated) retains the plurality of substrates W in a state in which adjacent substrates W are arranged in parallel to be spaced apart by a predetermined interval by supporting the plurality of substrates W in cooperation with the back side substrate support portion (not illustrated). Each portion is described in detail in the following.

The substrate storing container 1 is made of a resin such as a plastic material. When particularly not described, as the resin of the material, for example, a molding material having a lower hygroscopic property than that of the front side substrate contact portion 53 and the back side substrate contact portion 54 (described later) such as a cycloolefin polymer or a cycloolefin copolymer, or a conductive material such as carbon fiber, carbon powder, carbon nanotube, Ketjen black (registered trademark), a conductive polymer, etc. obtained by assigning conductivity to these alloys is selectively added to the resin of the molding material. In addition, glass fiber, carbon fiber, etc. may be added to the resin of the molding material to enhance rigidity.

As illustrated in FIG. 1, etc., the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of the above-mentioned material, and are configured so as to be integrally molded with the cycloolefin polymer in the first embodiment.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure the opening circumferential portion 28 which forms the container main body opening portion 21 in a substantially rectangular shape.

The opening circumferential portion 28 is provided at one end portion of the container main body 2, and the back wall 22 is located at the other end portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of twenty-five substrates W.

As illustrated in FIG. 1, latch engagement concave portions 231A, 231B, 241A, and 241B, which are concave outwardly from the substrate storing space 27, are formed at portions of the upper wall 23 and the lower wall 24 which are proximal to the opening circumferential portion 28. Each of the latch engagement concave portions 231A, 231B, 241A, and 241B is respectively formed in the vicinities of both right and left edge portions of the upper wall 23 and the lower wall 24. The total amount thereof is four.

As illustrated in FIG. 1, ribs 235A and 235B are provided so as to be integrally molded with the upper wall 23 at an outer face of the upper wall 23. The ribs 235A and 235B enhance rigidity of the container main body 2. A top flange 236 is fixed at a center portion of the upper wall 23. The top flange 236 becomes a member corresponding to a portion of the substrate storing container 1 from which it is hung to be suspended when suspending the substrate storing container 1 by an AMHS (Automated Material Handling System), PGV (Person Guided Vehicle), etc.

As illustrated in FIG. 1, substrate support plate-like portions 5 are provided at the first side wall 25 and the second side wall 26, respectively, and arranged in the substrate storing space 27 so as to form a pair in the left/right direction D3. Specifically, the substrate support plate-like portion 5 includes a plate portion 51, a plate portion support portion 52, the front side substrate contact portion 53, and the back side substrate contact portion 54. The substrate support plate-like portions 5 provided at the first side wall 25 and the second side wall 26, respectively, have the same shape, and thus only one of the substrate support plate-like portions 5 will be described below. In more detail, the substrate support plate-like portion 5 provided at the first side wall 25 may be used by being fixed to the second side wall 26, and the substrate support plate-like portion 5 provided at the second side wall 26 may be used by being fixed to the first side wall 25.

In addition, the front side substrate contact portion 53 and the back side substrate contact portion 54 are configured so as to be separate from the first plate portion support portion 521 and the third plate portion support portion 523 serving as a contact portion support portion. That is, as illustrated in FIG. 4, FIG. 5A to FIG. 5C, and FIG. 6A to 6C, the front side substrate contact portion 53 and the back side substrate contact portion 54 are configured as separate components removably attached to the first plate portion support portion 521 and the third plate portion support portion 523.

The plate portion 51 and the plate portion support portion 52 are configured by being integrally molded using a material having a lower heat-resisting property than that of the front side substrate contact portion 53 and the back side substrate contact portion 54 and a lower coefficient of moisture absorption than that of the front side substrate contact portion 53 and the back side substrate contact portion 54. Specifically, a molding material having a lower hygroscopic property than that of the front side substrate contact portion 53 and the back side substrate contact portion 54 such as a cycloolefin polymer or a cycloolefin copolymer is used for the plate portion 51 and the plate portion support portion 52. When conductivity is assigned to a resin of such a molding material, a conductive material such as carbon fiber, carbon powder, carbon nanotube, Ketjen black (registered trademark), a conductive polymer, etc. is selectively added to the resin of the molding material.

The plate portion 51 has a plate-like arc shape. Twenty-five of the plate portions 51 are provided at the first side wall 25 and the second side wall 26, respectively. The total number of the plate portions 51 is fifty. The adjacent plate portions 51 are arranged so as to be spaced apart in the upper/lower direction D2 by an interval of 10 mm to 12 mm in a parallel positional relationship. It should be noted that a member of substantially the same shape as the plate portion 51 is arranged above the plate portion 51 located at the top. This is a member that serves as a guide upon inserting for the substrate W to be inserted into the substrate storing space 27 to be located at the top.

Furthermore, the twenty-five plate portions 51 provided at the first side wall 25 and the twenty-five plate portions 51 provided at the second side wall 26 have a positional relationship opposite each other in the left/right direction D3. Furthermore, the fifty plate portions 51 and two members that serve as guides having substantially the same shape as the plate portion 51 have a positional relationship parallel to an inner face of the lower wall 24.

The plate portion support portion 52 includes the first plate portion support portion 521, a second plate portion support portion 522, and the third plate portion support portion 523 serving as a contact portion support portion, and these portions extend in the upper/lower direction D2. The twenty-five plate portions 51 provided at the first side wall 25 are connected to the first plate portion support portion 521, the second plate portion support portion 522, and the third plate portion support portion 523 provided on the first side wall 25 side. Similarly, the twenty-five plate portions 51 provided at the second side wall 26 are connected to the first plate portion support portion 521, the second plate portion support portion 522, and the third plate portion support portion 523 provided on the second side wall 26 side. The substrate support plate-like portions 5 are fixed to the first side wall 25 and the second side wall 26, respectively.

The first plate portion support portion 521 has a front side contact portion contact face 525 to which the front side substrate contact portion 53 is fixed by coming into contact therewith. As illustrated in FIG. 4, the front side contact portion contact face 525 has a rectangular shape elongated in the upper/lower direction D2, and has a flat face. An upper end portion and a lower end portion of the front side contact portion contact face 525, a center portion of the front side contact portion contact face 525 in the upper/lower direction, a middle portion between the upper end portion and the center portion, and a middle portion between the lower end portion and the center portion each have circular through-holes 526. The first plate portion support portion 521 supports the substrate contact portion 53.

The third plate portion support portion 523 has a back side contact portion contact face 527 to which the back side substrate contact portion 54 is fixed by coming into contact therewith. As illustrated in FIG. 4, the back side contact portion contact face 527 has a rectangular shape elongated in the upper/lower direction D2, and has a flat face. An upper end portion and a lower end portion of the back side contact portion contact face 527, a center portion of the back side contact portion contact face 527 in the upper/lower direction, a middle portion between the upper end portion and the center portion, and a middle portion between the lower end portion and the center portion each have circular through-holes 528.

As illustrated in FIG. 5A to FIG. 5C, the front side substrate contact portion 53 has a front side plate-shaped base portion 531, a front side inward convex portion 532, and a front side fixed convex portion 533, and these portions are integrally molded. The front side substrate contact portion 53 touches the substrate W when the substrate support plate-like portion 5 supports the edge portion of the substrate W. The front side substrate contact portion 53 is made of a material having a heat-resisting property with respect to temperature of the substrate W touching the front side substrate contact portion 53. More specifically, the front side substrate contact portion 53 is made of a PEEK material, etc. When conductivity is assigned to the PEEK material, a conductive material such as carbon fiber, carbon powder, carbon nanotube, Ketjen black (registered trademark), a conductive polymer, etc. is selectively added to resin of the molding material.

The front side plate-shaped base portion 531 has a rectangular plate shape slightly smaller than the front side contact portion contact face 525. A back face of the front side plate-shaped base portion 531 faces and abuts the front side contact portion contact face 525 (see FIG. 4) in a substantially matching positional relationship.

The front side inward convex portion 532 has a plate shape extending from a top face of the front side plate-shaped base portion 531 to an inside of the substrate storing space 27. The front side inward convex portion 532 has a tapered shape in planar view parallel to the forward/backward direction D1 and the left/right direction D3 as illustrated in FIG. 2, FIG. 5A, etc., and has a tapered shape in the upper/lower direction D2 as illustrated in FIG. 5B. A thickness direction of the front side inward convex portion 532 connecting an upper face and a lower face of the front side inward convex portion 532 to each other matches the upper/lower direction D2.

A substantially semi-circular convex portion 534 is present on the upper face of the front side inward convex portion 532. The substantially semi-circular convex portion 534 extends from a base portion up to a distal end portion of the front side inward convex portion 532, and a cross section orthogonal to a direction in which the substantially semi-circular convex portion 534 extends has a substantially semi-circular shape having a convex shape in the upper direction D21. An edge portion of a lower face of the substrate W abuts an uppermost portion of the substantially semi-circular convex portion 534. In this way, the substrate W is supported by the substrate support plate-like portion 5.

As illustrated in FIG. 5B and FIG. 5C, the front side fixed convex portion 533 has a disk shape. A shaft center of the front side fixed convex portion 533 has a positional relationship parallel to a normal direction of the back face of the front side plate-shaped base portion 531 (surface of the front side plate-shaped base portion 531 appearing in FIG. 5C), and the front side fixed convex portion 533 protrudes from the back face of the front side plate-shaped base portion 531. The front side fixed convex portion 533 can be press-fit to the through-hole 526 (refer to FIG. 4, etc.). When the front side fixed convex portion 533 is press-fit to the through-hole 526, the front side substrate contact portion 53 is fixed to the first plate portion support portion 521 of the plate portion support portion 52.

As described in the foregoing, since the substrate support plate-like portions 5 provided at the first side wall 25 and the second side wall 26, respectively, have the same shape, the front side substrate contact portion 53 of the substrate support plate-like portion 5 provided at the first side wall 25 can be fixed to the first plate portion support portion 521 of the substrate support plate-like portion 5 provided at the second side wall 26. Similarly, the front side substrate contact portion 53 of the substrate support plate-like portion 5 provided at the second side wall 26 can be fixed to the first plate portion support portion 521 of the substrate support plate-like portion 5 provided at the first side wall 25.

As illustrated in FIG. 6A to FIG. 6C, the back side substrate contact portion 54 has a back side plate-shaped base portion 541, a back side inward convex portion 542, and a back side fixed convex portion 543, and these portions are integrally molded. The back side substrate contact portion 54 touches the substrate W when the substrate support plate-like portion 5 supports the edge portion of the substrate W. The back side substrate contact portion 54 is made of a material having a heat-resisting property with respect to temperature of the substrate W touching the back side substrate contact portion 54. More specifically, the back side substrate contact portion 54 is made of a PEEK material, etc. When conductivity is assigned to the PEEK material, a conductive material such as carbon fiber, carbon powder, carbon nanotube, Ketjen black (registered trademark), a conductive polymer, etc. is selectively added to resin of the molding material.

The back side plate-shaped base portion 541 has a rectangular plate shape slightly smaller than the back side contact portion contact face 527. A back face of the back side plate-shaped base portion 541 faces and abuts the back side contact portion contact face 527 in a substantially matching positional relationship.

The back side inward convex portion 542 has a plate shape extending from a top face of the back side plate-shaped base portion 541 to an inside of the substrate storing space 27. The back side inward convex portion 542 has a tapered shape in planar view parallel to the forward/backward direction D1 and the left/right direction D3 as illustrated in FIG. 2, FIG. 6A, etc., and has a tapered shape in the upper/lower direction D2 as illustrated in FIG. 6B. A thickness direction of the back side inward convex portion 542 connecting an upper face and a lower face of the back side inward convex portion 542 to each other matches the upper/lower direction D2.

A substantially semi-circular convex portion such as the substantially semi-circular convex portion 534 of the front side substrate contact portion 53 is not present on the upper face of the back side inward convex portion 542. The edge portion of the lower face of the substrate W abuts an edge portion of the upper face of the back side inward convex portion 542. In this way, the substrate W is supported by the substrate support plate-like portion 5.

As illustrated in FIG. 6B and FIG. 6C, the back side fixed convex portion 543 has a disk shape. A shaft center of the back side fixed convex portion 543 has a positional relationship parallel to a normal direction of the back face of the back side plate-shaped base portion 541 (surface of the back side plate-shaped base portion 541 appearing in FIG. 6C), and the back side fixed convex portion 543 protrudes from the back face of the back side plate-shaped base portion 541. The back side fixed convex portion 543 can be press-fit to the through-hole 528 (refer to FIG. 4, etc.). When the back side fixed convex portion 543 is press-fit to the through-hole 528, the back side substrate contact portion 54 is removably fixed to the third plate portion support portion 523 of the plate portion support portion 52.

As described in the foregoing, since the substrate support plate-like portions 5 provided at the first side wall 25 and the second side wall 26, respectively, have the same shape, the back side substrate contact portion 54 of the substrate support plate-like portion 5 provided at the first side wall 25 can be removably fixed to the third plate portion support portion 523 of the substrate support plate-like portion 5 provided at the second side wall 26. Similarly, the back side substrate contact portion 54 of the substrate support plate-like portion 5 provided at the second side wall 26 can be removably fixed to the third plate portion support portion 523 of the substrate support plate-like portion 5 provided at the first side wall 25.

The edge portions of the plurality of substrates W may be supported by the substrate support plate-like portion 5 having the above-described configuration in a state in which adjacent substrates W among the plurality of substrates W are spaced apart by a predetermined interval and are in a parallel positional relationship.

The back side substrate support portion (not illustrated) has a wall portion substrate support portion (not illustrated). The wall portion substrate support portion (not illustrated) is provided by being formed at a rear edge portion of the plate portion 51 of the substrate support plate-like portion 5. The wall portion substrate support portion (not illustrated) may be molded integrally with the container main body 2.

The number of wall portion substrate support portions (not illustrated) corresponds to every one of the substrates W that can be stored in the substrate storing space 27. Specifically, twenty five wall portion substrate support portions are provided. Wall portion substrate support portions (not illustrated) provided at the first side wall 25 and the second side wall 26 have a positional relationship forming a pair in the left/right direction D3. In addition, the wall portion substrate support portions (not illustrated) provided at the first side wall 25 and the second side wall 26 have a positional relationship forming a pair with the front retainer (not illustrated) (described later) in the forward/backward direction D1. The substrate W is stored in the substrate storing space 27, and the wall portion substrate support portions (not illustrated) put an end edge of the edge portion of the substrate W therebetween when the lid body 3 is closed.

As illustrated in FIG. 1, the lid body 3 has a substantially rectangular shape approximately matching the shape of the opening circumferential portion 28 of the container main body 2. The lid body 3 is removably attached to the opening circumferential portion 28 of the container main body 2, and the lid body 3 may close the container main body opening portion 21 when the lid body 3 is installed in the opening circumferential portion 28. The annular sealing member 4 is attached to an inner face of the lid body 3 (a surface on a back side of the lid body 3 illustrated in FIG. 1) corresponding to a face facing a surface (sealing surface 281) of a stepped portion formed at a position immediately after the opening circumferential portion 28 in the backward direction D12 when the lid body 3 closes the container main body opening portion 21. The sealing member 4 is made of various thermoplastic elastomers such as elastically deformable polyester, polyolefin, etc., fluorocarbon rubber, silicone rubber, etc. The sealing member 4 is disposed around an outer circumferential edge portion of the lid body 3.

When the lid body 3 is installed in the opening circumferential portion 28, the sealing member 4 is elastically deformed by being interposed between the sealing surface 281 and the inner face of the lid body 3, and the lid body 3 closes the container main body opening portion 21 in a sealed state. The substrate W may be loaded or unloaded relative to the substrate storing space 27 in the container main body 2 by removing the lid body 3 from the opening circumferential portion 28.

A latching mechanism is provided at the lid body 3. The latching mechanism is provided in the vicinity of both left and right end portions of the lid body 3. As illustrated in FIG. 1, the latching mechanism includes two upper side latch portions 32A and 32B that can project from the upper side of the lid body 3 in the upper direction D21 and two lower side latch portions 32C and 32D that can project from the lower side of the lid body 3 in the lower direction D22. The two upper side latch portions 32A and 32B are arranged in the vicinity of both left and right ends of the upper side of the lid body 3 and the two lower side latch portions 32C and 32D are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portions 32A and 32B, and the lower side latch portions 32C and 32D to project from the upper side and the lower side of the lid body 3 as well as possible to make a state not projecting from the upper side and the lower side of the lid body 3. The lid body 3 is fixed to the opening circumferential portion 28 of the container main body 2 by the upper side latch portions 32A and 32B projecting from the upper side of the lid body 3 in the upper direction D21 to engage with the latch engagement concave portions 231A and 231B of the container main body 2 and the lower side latch portions 32C and 32D projecting from the lower side of the lid body 3 in the lower direction D22 to engage with the latch engagement concave portions 241A and 241B of the container main body 2.

The front retainer (not illustrated) is provided by being fixed on the inside of a main lid body 30 of the lid body 3. The front retainer (not illustrated) has a front retainer substrate receiving portion (not illustrated). Two front retainer substrate receiving portions (not illustrated) are arranged at a time to form a pair spaced apart by a predetermined interval in the left/right direction D3. Twenty five pairs of front retainer substrate receiving portions (not illustrated), two of which are arranged at a time to form a pair, are provided by being arranged in parallel in the upper/lower direction D2. When the substrate W is stored in the substrate storing space 27, and the lid body 3 is closed, the front retainer substrate receiving portions (not illustrated) put and support the end edge of the edge portion of the substrate W therebetween.

The following effect can be obtained in accordance with the substrate storing container 1 according to the first embodiment with the abovementioned configuration.

As mentioned above, the substrate storing container 1 includes the container main body 2 in which the substrate storing space 27 capable of storing the plurality of substrates W is formed therein and the container main body opening portion 21 in communication with the substrate storing space 27 is formed at the one end portion, the lid body 3 which can be removably attached to the container main body opening portion 21 and can close the container main body opening portion 21, and the substrate support plate-like portions 5 serving as lateral substrate support portions which are disposed to form a pair in the substrate storing space 27 and can support the edge portions of the plurality of substrates W in a state in which adjacent substrates W among the plurality of substrates W are arranged in parallel to be spaced by a predetermined interval when the container main body opening portion 21 is closed by the lid body 3. The substrate support plate-like portion 5 includes the front side substrate contact portion 53 and the back side substrate contact portion 54 touching the substrate W when the edge portion of the substrate W is supported, and the first plate portion support portion 521 and the third plate portion support portion 523 serving as a contact portion support portion that support the front side substrate contact portion 53 and the back side substrate contact portion 54. The front side substrate contact portion 53 and the back side substrate contact portion 54 are made of a material having a heat-resisting property with respect to temperature of the substrate W touching the front side substrate contact portion 53 and the back side substrate contact portion 54. The first plate portion support portion 521 and the third plate portion support portion 523 are made of a material having a lower heat-resisting property than that of the front side substrate contact portion 53 and the back side substrate contact portion 54 and having a lower coefficient of moisture absorption than that of the front side substrate contact portion 53 and the back side substrate contact portion 54.

According to this configuration, the substrate support plate-like portion 5 serving as a lateral substrate support portion includes the front side substrate contact portion 53 and the back side substrate contact portion 54 touching the substrate W when the edge portion of the substrate W is supported, and the first plate portion support portion 521 and the third plate portion support portion 523 serving as a contact portion support portion that support the front side substrate contact portion 53 and the back side substrate contact portion 54, and the front side substrate contact portion 53 and the back side substrate contact portion 54 are made of a material having a heat-resisting property with respect to temperature of the substrate W touching the front side substrate contact portion 53 and the back side substrate contact portion 54. Thus, it is possible to inhibit scratches from being generated in the front side substrate contact portion 53 and the back side substrate contact portion 54, and to inhibit resin included in the front side substrate contact portion 53 and the back side substrate contact portion 54 from melting. For this reason, the back surface of the substrate W may be inhibited from being damaged when the substrate W is loaded or unloaded relative to the substrate storing space 27. In addition, it is possible to inhibit a dimension of the substrate storing container 1 from changing due to heat strain and deviating from a standard substrate height, etc., and to suppress generation of damage to the substrate due to contact with a substrate ejector. For this reason, the substrate storing container 1 may be used in a conventional process in which the substrate storing container 1 made of a material having a heat-resisting property is used.

In addition, the first plate portion support portion 521 and the third plate portion support portion 523 serving as a contact portion support portion are made of a material having a lower coefficient of moisture absorption than that of the front side substrate contact portion 53 and the back side substrate contact portion 54. Thus, when the substrate storing space 27 is purged with nitrogen, etc., and the humidity of the substrate storing space 27 decreases, water may be inhibited from being released from the first plate portion support portion 521 and the third plate portion support portion 523. For this reason, the substrate W may be inhibited from being adversely affected by water as much as possible.

In addition, the front side substrate contact portion 53 and the back side substrate contact portion 54 are configured so as to be separate from the first plate portion support portion 521 and the third plate portion support portion 523 serving as a contact portion support portion, and fixed to the first plate portion support portion 521 and the third plate portion support portion 523 serving as a contact portion support portion. According to this configuration, when the front side substrate contact portion 53 and the back side substrate contact portion 54 are used and damaged, the front side substrate contact portion 53 and the back side substrate contact portion 54 may be easily replaced. In addition, the front side substrate contact portion 53 and the back side substrate contact portion 54 may be replaced with ones having different shapes, and the ones may be used.

In addition, the container main body 2 has the first side wall 25 and the second side wall 26 serving as a pair of side walls, and a pair of substrate support plate-like portions 5 serving as the lateral substrate support portions is provided. One of the substrate support plate-like portions 5 is fixed to the first side wall 25 serving as one of the side walls, and the other one of the substrate support plate-like portions 5 serving as the lateral substrate support portion is fixed to the second side wall 26 serving as the other one of the side walls. The one of the substrate support plate-like portions 5 serving as the lateral substrate support portion can be fixed to the second side wall 26 serving as the other one of the side walls, and the other one of the substrate support plate-like portions 5 serving as the lateral substrate support portion can be fixed to the first side wall 25 serving as the one of the side walls. The front side substrate contact portion 53 and the back side substrate contact portion 54 of the one of the substrate support plate-like portions 5 can be fixed to the first plate portion support portion 521 and the third plate portion support portion 523 serving as the contact portion support portion of the other one of the substrate support plate-like portions 5, respectively. Further, the front side substrate contact portion 53 and the back side substrate contact portion 54 of the other one of the substrate support plate-like portions 5 can be fixed to the front side substrate contact portion 53 and the back side substrate contact portion 54 of the one of the substrate support plate-like portions 5, respectively.

According to this configuration, the substrate support plate-like portion 5 serving as the lateral substrate support portion can be removably fixed to either the first side wall 25 or the second side wall 26. In addition, the front side substrate contact portion 53 can be removably fixed to either the first plate portion support portion 521 of the one of the substrate support plate-like portions 5 or the first plate portion support portion 521 of the other one of the substrate support plate-like portions 5. Similarly, in addition, the back side substrate contact portion 54 can be removably fixed to either the third plate portion support portion 523 of the one of the substrate support plate-like portions 5 or the third plate portion support portion 523 of the other one of the substrate support plate-like portions 5. For this reason, it is possible to attempt to reduce the manufacture costs of the front side substrate contact portion 53, the back side substrate contact portion 54, and the substrate support plate-like portions 5.

In addition, the container main body 2 is made of a material having a lower coefficient of moisture absorption than that of the front side substrate contact portion 53 and the back side substrate contact portion 54. According to this configuration, when the substrate storing space 27 is purged with nitrogen, etc., and the humidity of the substrate storing space 27 decreases, water may be inhibited from being released from the container main body 2. For this reason, the substrate W may be effectively inhibited from being adversely affected by water. Herein, when the front side substrate contact portion 53 and the back side substrate contact portion 54 are fixed to the first plate portion support portion 521 and the third plate portion support portion 523 serving as a contact portion support portion, a method other than the above-described press-fitting, for example, heat caulking or fixing by a hook may be used.

Figure 7:
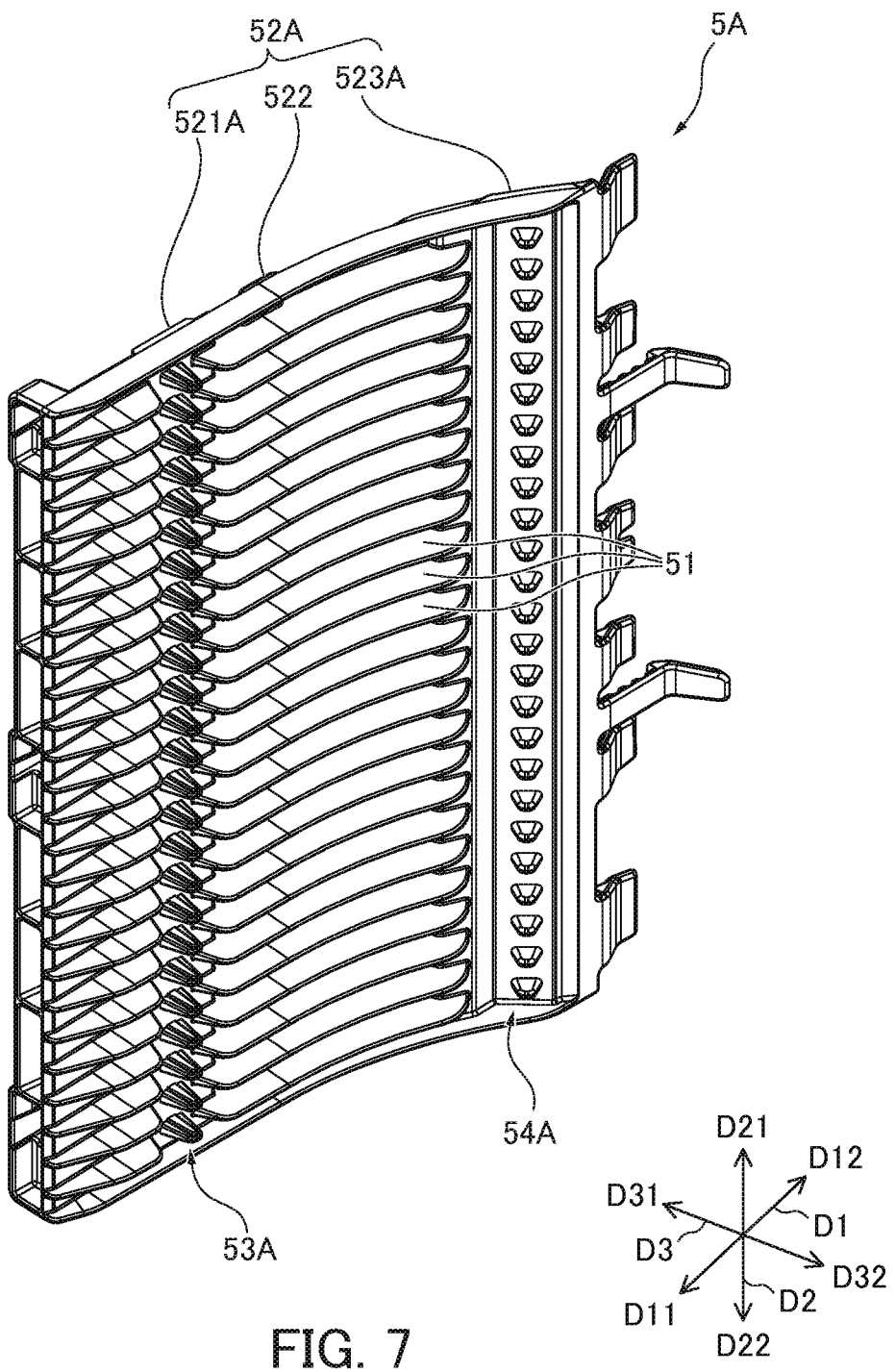
FIG. 7 is a perspective view illustrating a substrate support plate-like portion 5A of a substrate storing container according to a second embodiment of the invention.
Figure 8:
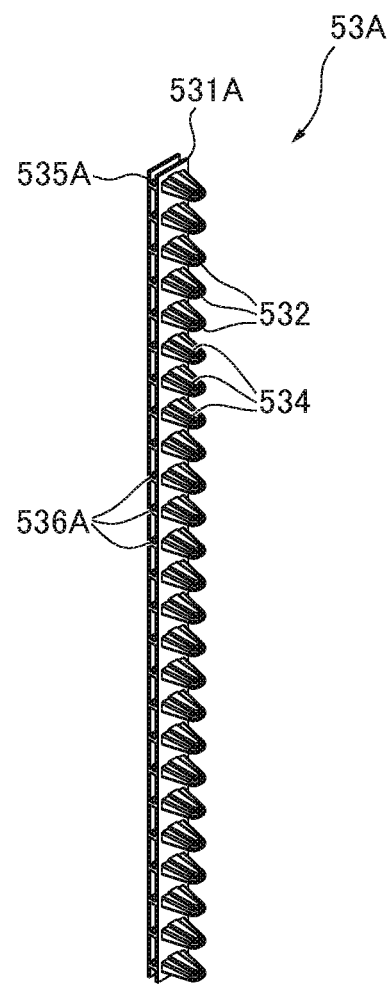
FIG. 8 is a perspective view illustrating a front side substrate contact portion 53A of the substrate storing container according to the second embodiment of the invention.
Figure 9:
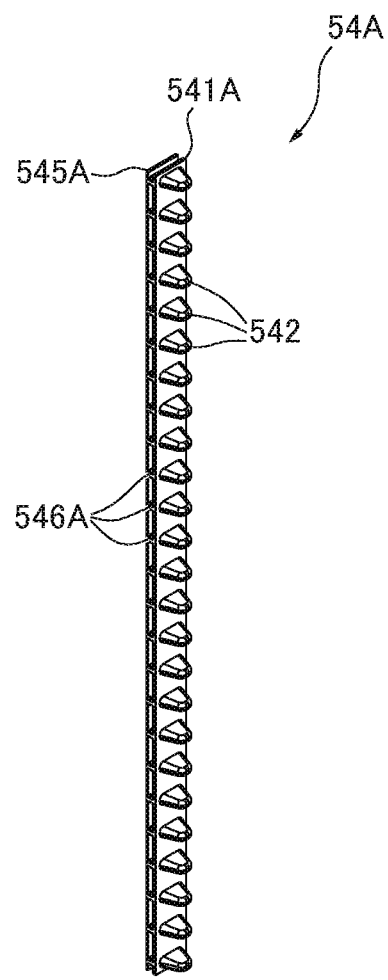
FIG. 9 is a perspective view illustrating a back side substrate contact portion 54A of the substrate storing container according to the second embodiment of the invention.
Figure 10:
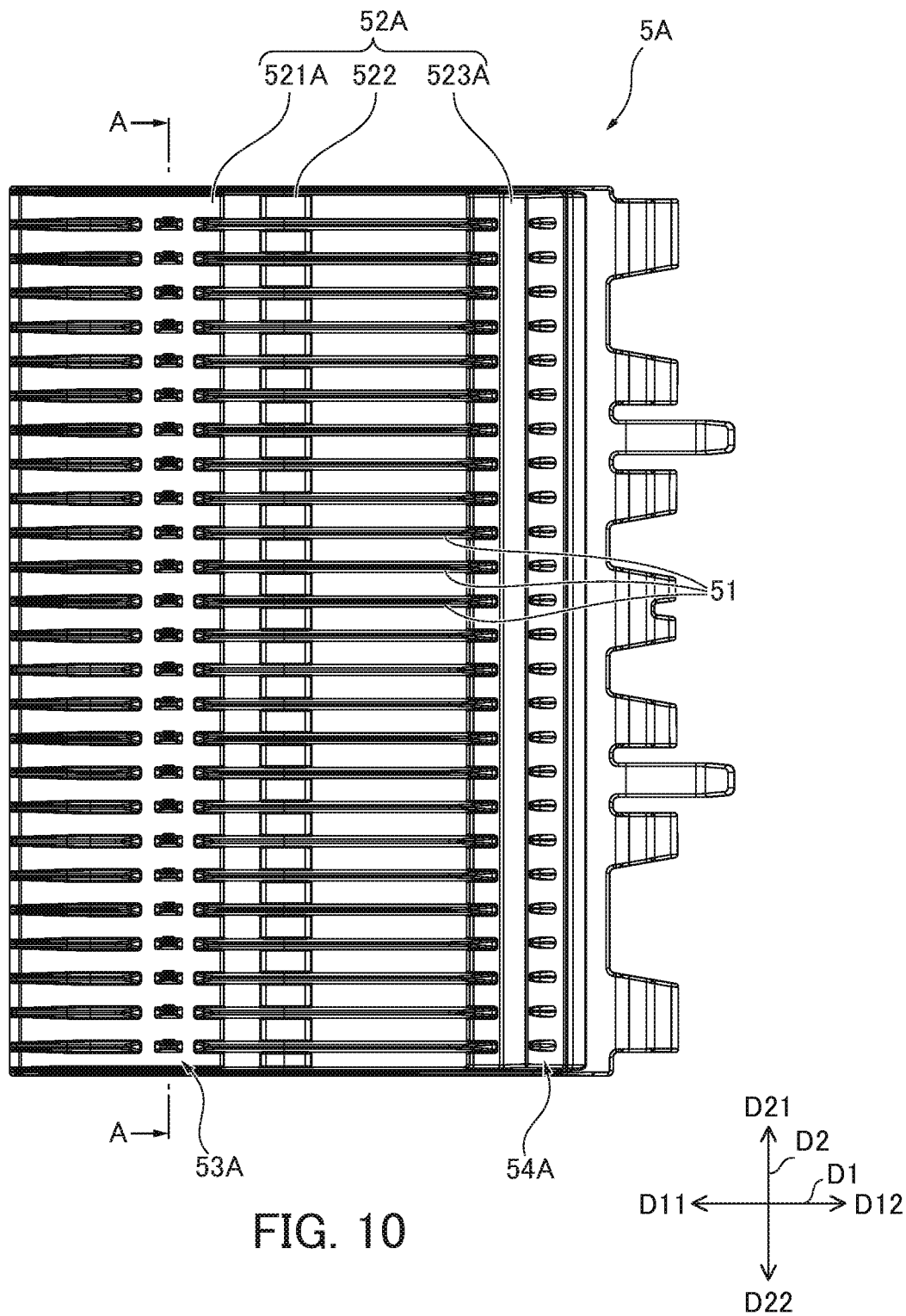
FIG. 10 is a front view illustrating the substrate support plate-like portion 5A of the substrate storing container according to the second embodiment of the invention.
Figure 11:
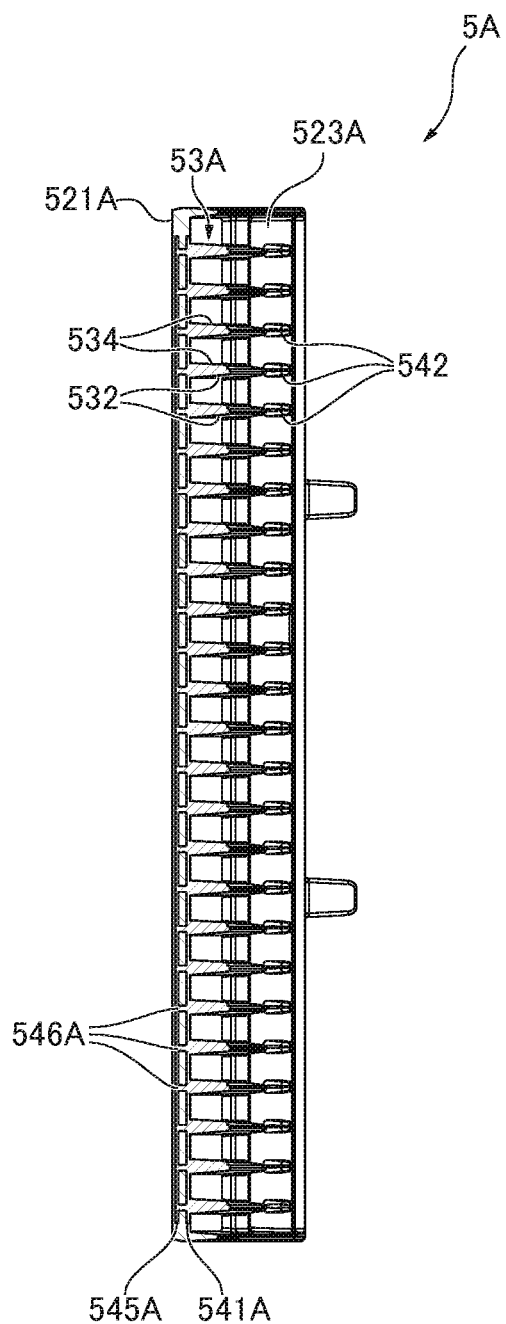
FIG. 11 is a cross-sectional view taken along line A-A of FIG. 10.

Hereinafter, a description will be given of a substrate storing container according to a second embodiment of the invention with reference to FIG. 7 to FIG. 11. FIG. 7 is a perspective view illustrating a substrate support plate-like portion 5A of the substrate storing container according to the second embodiment of the invention. FIG. 8 is a perspective view illustrating a front side substrate contact portion 53A of the substrate storing container according to the second embodiment of the invention. FIG. 9 is a perspective view illustrating a back side substrate contact portion 54A of the substrate storing container according to the second embodiment of the invention. FIG. 10 is a front view illustrating the substrate support plate-like portion 5A of the substrate storing container according to the second embodiment of the invention. FIG. 11 is a cross-sectional view taken along line A-A of FIG. 10.

The substrate support plate-like portion 5A of the substrate storing container according to the second embodiment is different from the substrate support plate-like portion 5 of the substrate storing container 1 according to the first embodiment in that the front side substrate contact portion 53A is fixed to a first plate portion support portion 521A serving as a contact portion support portion using insert molding, and the back side substrate contact portion 54A is fixed to a third plate portion support portion 523A serving as a contact portion support portion using insert molding. Configurations of other respective portions are similar to configurations of respective portions of the substrate storing container 1 according to the first embodiment. The same reference symbols will be assigned to the same configurations as those in the first embodiment, and a description thereof will be omitted.

As illustrated in FIG. 7, in the substrate support plate-like portion 5A, the front side substrate contact portion 53A is fixed to the first plate portion support portion 521A using insert molding. As illustrated in FIG. 8, the front side substrate contact portion 53A includes a front side plate-shaped base portion 531A, a front side inward convex portion 532, a front side plate-shaped base portion parallel plate 535A, and a parallel plate connecting portion 536A. All these portions are made of the same PEEK material.

The front side plate-shaped base portion 531A has the same configuration as that of the front side plate-shaped base portion 531 in the first embodiment. The front side plate-shaped base portion parallel plate 535A has a rectangular plate shape, which is the same shape as that of the front side plate-shaped base portion 531A. The parallel plate connecting portion 536A is molded integrally with the front side plate-shaped base portion 531A and the front side plate-shaped base portion parallel plate 535A, and connects the front side plate-shaped base portion 531A and the front side plate-shaped base portion parallel plate 535A to each other. In this way, the front side plate-shaped base portion 531A and the front side plate-shaped base portion parallel plate 535A have a parallel positional relationship. The parallel plate connecting portion 536A has a positional relationship opposite the front side inward convex portion 532 in a direction of connecting the front side plate-shaped base portion 531A and the front side plate-shaped base portion parallel plate 535A to each other.

The front side substrate contact portion 53A is set in a mold, and the front side plate-shaped base portion 531A, the front side plate-shaped base portion parallel plate 535A, and the parallel plate connecting portion 536A are molded by a resin material such as a melted cycloolefin polymer. Then, the melted resin material is cooled and becomes a plate portion support portion 52A including the first plate portion support portion 521A. In this way, as illustrated in FIG. 7, FIG. 10, and FIG. 11, the front side substrate contact portion 53A is insert-molded and fixed to the first plate portion support portion 521A.

In addition, as illustrated in FIG. 7, in the substrate support plate-like portion 5A, the back side substrate contact portion 54A is fixed to the third plate portion support portion 523A using insert molding. As illustrated in FIG. 9, the back side substrate contact portion 54A includes a back side plate-shaped base portion 541A, a back side inward convex portion 542, a back side plate-shaped base portion parallel plate 545A, and a parallel plate connecting portion 546A. All these portions are made of the same PEEK material.

The back side plate-shaped base portion 541A has the same configuration as that of the back side plate-shaped base portion 541 in the first embodiment. The back side plate-shaped base portion parallel plate 545A has a rectangular plate shape which is the same shape as that of the back side plate-shaped base portion 541A. The parallel plate connecting portion 546A is molded integrally with the back side plate-shaped base portion 541A and the back side plate-shaped base portion parallel plate 545A, and connects the back side plate-shaped base portion 541A and the back side plate-shaped base portion parallel plate 545A to each other. In this way, the back side plate-shaped base portion 541A and the back side plate-shaped base portion parallel plate 545A have a parallel positional relationship. The parallel plate connecting portion 546A has a positional relationship opposite the back side inward convex portion 542 in a direction of connecting the back side plate-shaped base portion 541A and the back side plate-shaped base portion parallel plate 545A to each other.

The back side substrate contact portion 54A is set in a mold, and the back side plate-shaped base portion 541A, the back side plate-shaped base portion parallel plate 545A, and the parallel plate connecting portion 546A are molded by a resin material such as a melted cycloolefin polymer. Then, the melted resin material is cooled and becomes a plate portion support portion 52A including the third plate portion support portion 523A. In this way, as illustrated in FIG. 7 and FIG. 10, the back side substrate contact portion 54A is insert-molded and fixed to the third plate portion support portion 523A.

The following effect can be obtained in accordance with the substrate storing container according to the second embodiment with the abovementioned configuration.

As described in the foregoing, the front side substrate contact portion 53A and the back side substrate contact portion 54A are fixed to the first plate portion support portion 521A and the third plate portion support portion 523A serving as a contact portion support portion, respectively, using insert molding. According to this configuration, it is possible to eliminate gaps between the front side substrate contact portion 53A and the first plate portion support portion 521A and between the back side substrate contact portion 54A and the third plate portion support portion 523A, and to reduce any water remaining after cleaning the substrate storing container.

Figure 12:
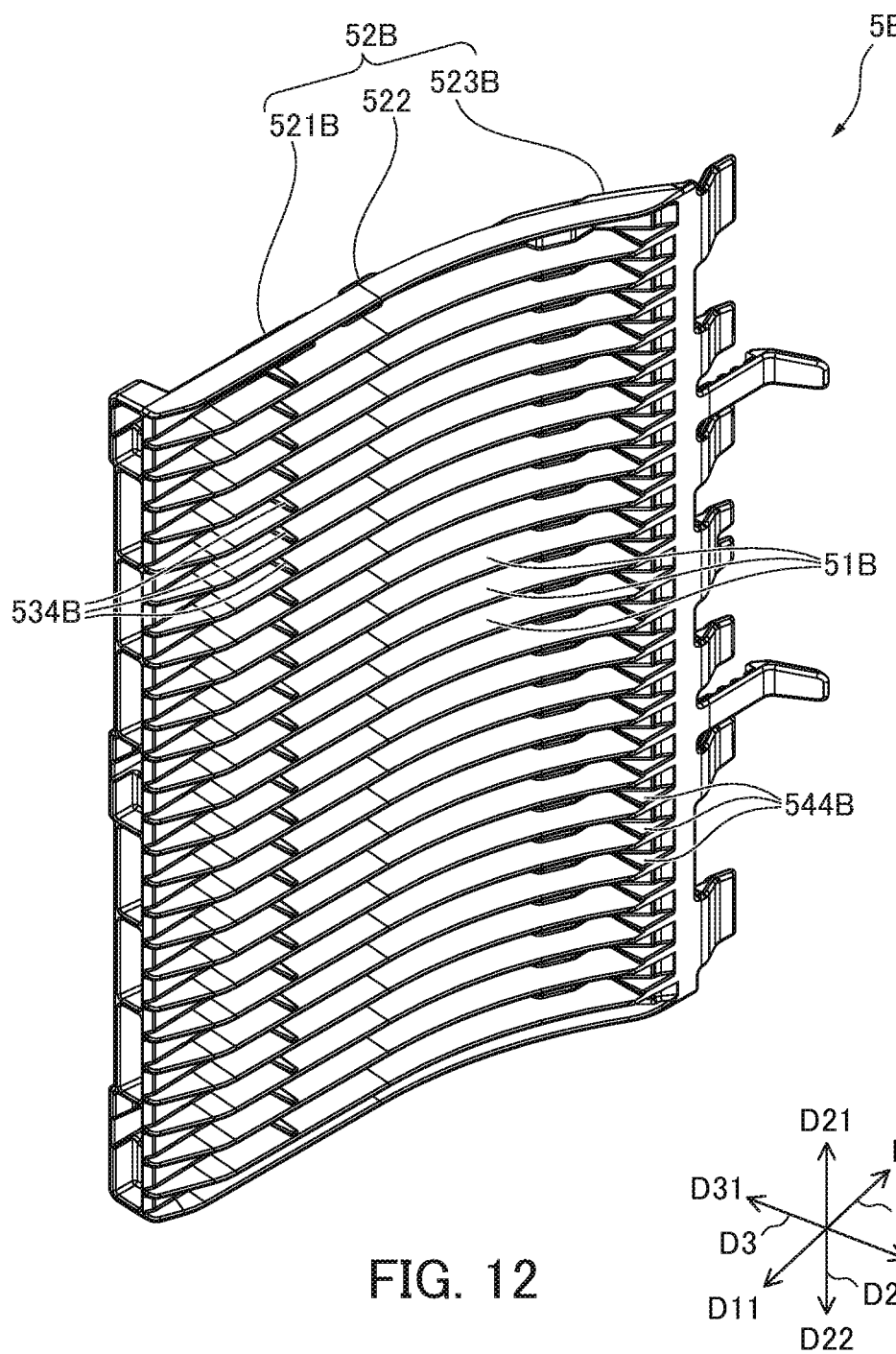
FIG. 12 is a perspective view illustrating a substrate support plate-like portion 5B of a substrate storing container according to a third embodiment of the invention.

Hereinafter, a description will be given of a substrate storing container according to a third embodiment of the invention with reference to FIG. 12. FIG. 12 is a perspective view illustrating a substrate support plate-like portion 5B of the substrate storing container according to the third embodiment of the invention.

The substrate support plate-like portion 5B of the substrate storing container according to the third embodiment is different from the substrate support plate-like portion 5 of the substrate storing container 1 according to the first embodiment in that a substantially semi-circular convex member 534B included in a front side substrate contact portion is formed using overmolding with respect to a plate portion 51B included in a contact portion support portion, and a plate-shaped inclined convex member 544B included in a back side substrate contact portion is formed using overmolding with respect to the plate portion 51B included in the contact portion support portion. Configurations of other respective portions are similar to configurations of respective portions of the substrate storing container 1 according to the first embodiment. The same reference symbols will be assigned to the same configurations as those in the first embodiment, and a description thereof will be omitted.

The substrate support plate-like portion 5B includes the front side substrate contact portion having twenty five substantially semi-circular convex members 534B and the back side substrate contact portion having twenty five plate-shaped inclined convex members 544B. The substantially semi-circular convex member 534B has the same shape as that of the substantially semi-circular convex portion 534 in the first embodiment. A longitudinal direction of the substantially semi-circular convex member 534B has a positional relationship substantially orthogonal to a longitudinal direction of the plate portion 51B, and one substantially semi-circular convex member 534B is formed at a time at an upper face close to a front of the plate portion 51B using overmolding.

The plate-shaped inclined convex member 544B has a substantially rectangular plate shape. The plate-shaped inclined convex member 544B is formed to be slightly inclined toward a center portion of the container. One plate-shaped inclined convex member 544B is formed at a time using overmolding at an upper face close to a rear of the plate portion 51B in a positional relationship substantially orthogonal to the longitudinal direction of the plate portion 51B.

Overmolding of the substantially semi-circular convex member 534B and the plate-shaped inclined convex member 544B with respect to the plate portion 51B is performed through the following processes.

First, a resin material such as a melted cycloolefin polymer corresponding to the plate portion 51B is molded, and the substrate support plate-like portion 5B in a state in which the substantially semi-circular convex member 534B and the plate-shaped inclined convex member 544B are not present is molded. Next, the substrate support plate-like portion 5B in a state in which the substantially semi-circular convex member 534B is not present is disposed in an injection mold, and a melted PEEK material is injection-molded on the plate portion 51B of the substrate support plate-like portion 5B. The substantially semi-circular convex member 534B and the plate-shaped inclined convex member 544B made of the PEEK material are formed by being overmolded with respect to the plate portion 51B.

When the melted PEEK material is injection-molded on the plate portion 51B of the substrate support plate-like portion 5B, a mold temperature in injection molding is maintained at a glass transition point of the cycloolefin polymer corresponding to the plate portion 51B or less so that the plate portion 51B does not warp. Thermophysical coupling is considered to occur when the melted PEEK material comes into contact with a cycloolefin polymer, which is not melted. In this way, the substantially semi-circular convex member 534B and the plate-shaped inclined convex member 544B are molded by overmolding in the plate portion 51B.

The following effect can be obtained in accordance with the substrate storing container according to the third embodiment with the abovementioned configuration.

As described in the foregoing, the substantially semi-circular convex member 534B and the plate-shaped inclined convex member 544B serving as substrate contact portions are formed by overmolding with respect to the plate portion 51B serving as a contact portion support portion. According to this configuration, it is possible to eliminate gaps between the substantially semi-circular convex member 534B and the plate portion 51B and between the plate-shaped inclined convex member 544B and the plate portion 51B, and to reduce any water remaining after cleaning the substrate storing container. In addition, it is possible to reduce the amount of the resin material included in the substrate contact portion.

Hereinafter, a description will be given of a substrate storing container according to a fourth embodiment of the invention with reference to FIG. 13 to FIG. 19.

Figure 13:
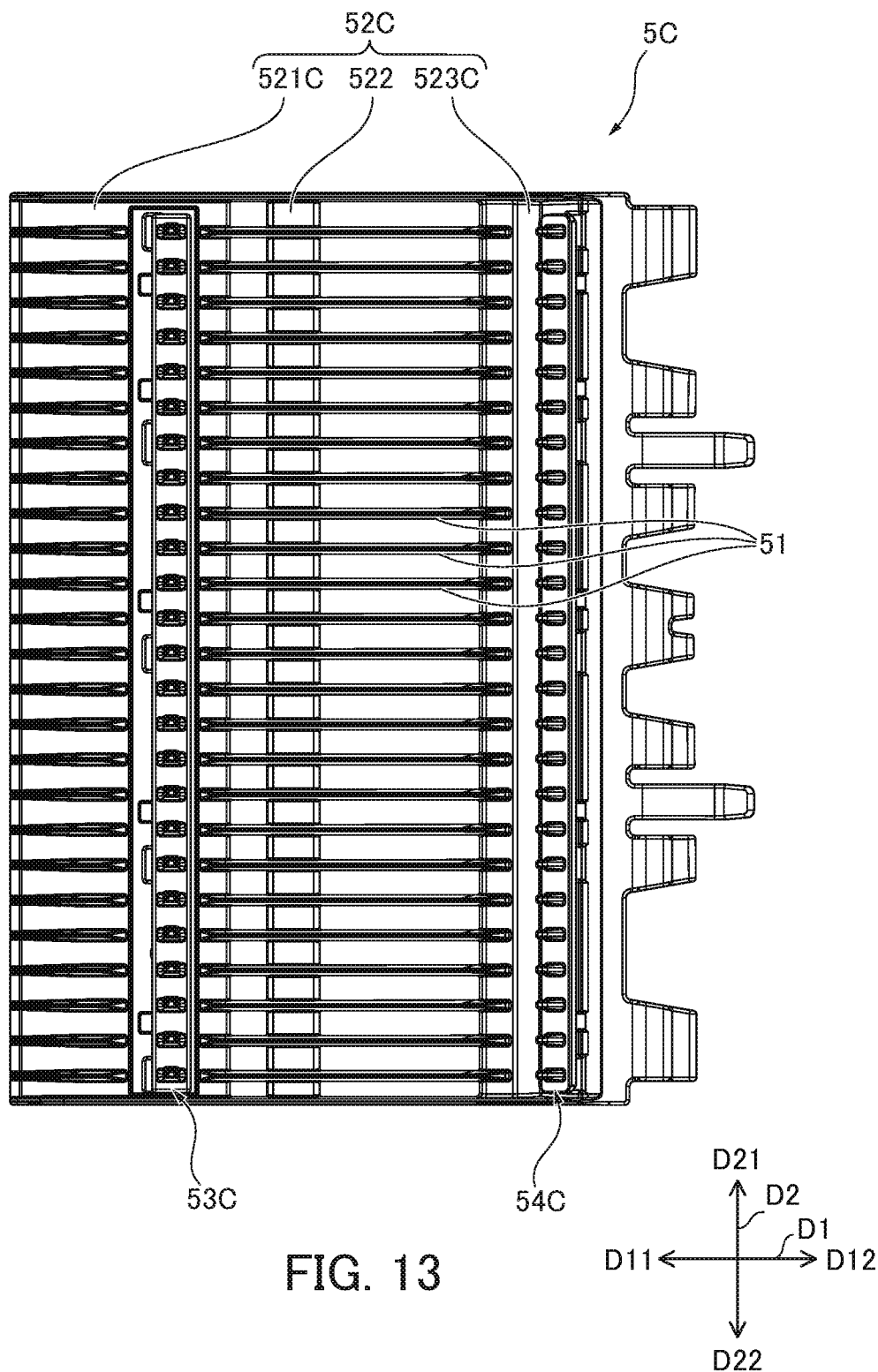
FIG. 13 is a front view illustrating a substrate support plate-like portion 5C of a substrate storing container according to a fourth embodiment of the invention.
Figure 14:
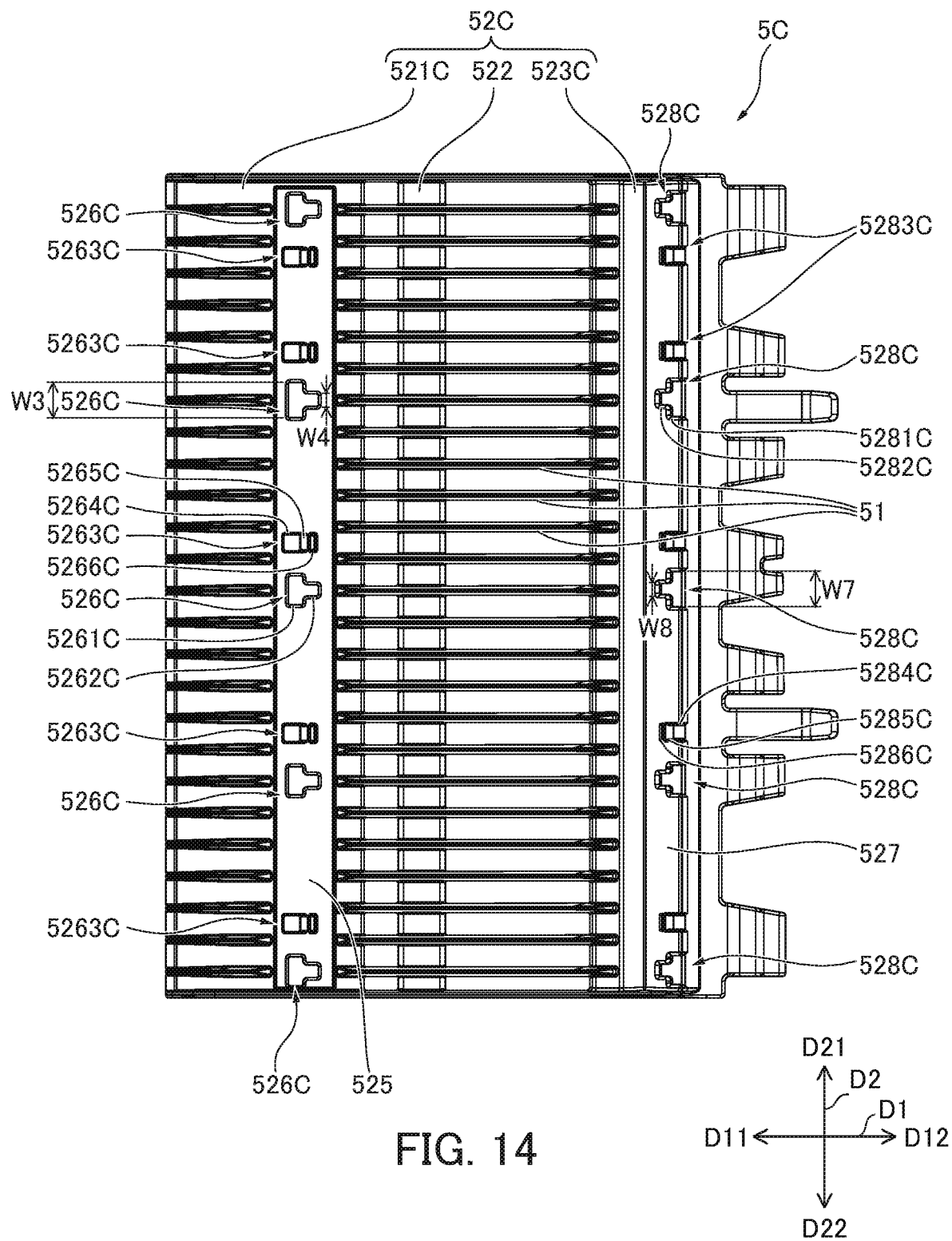
FIG. 14 is a front view illustrating a state in which a front side substrate contact portion 53C and a back side substrate contact portion 54C are removed from the substrate support plate-like portion 5C of the substrate storing container according to the fourth embodiment of the invention.
Figure 15A:
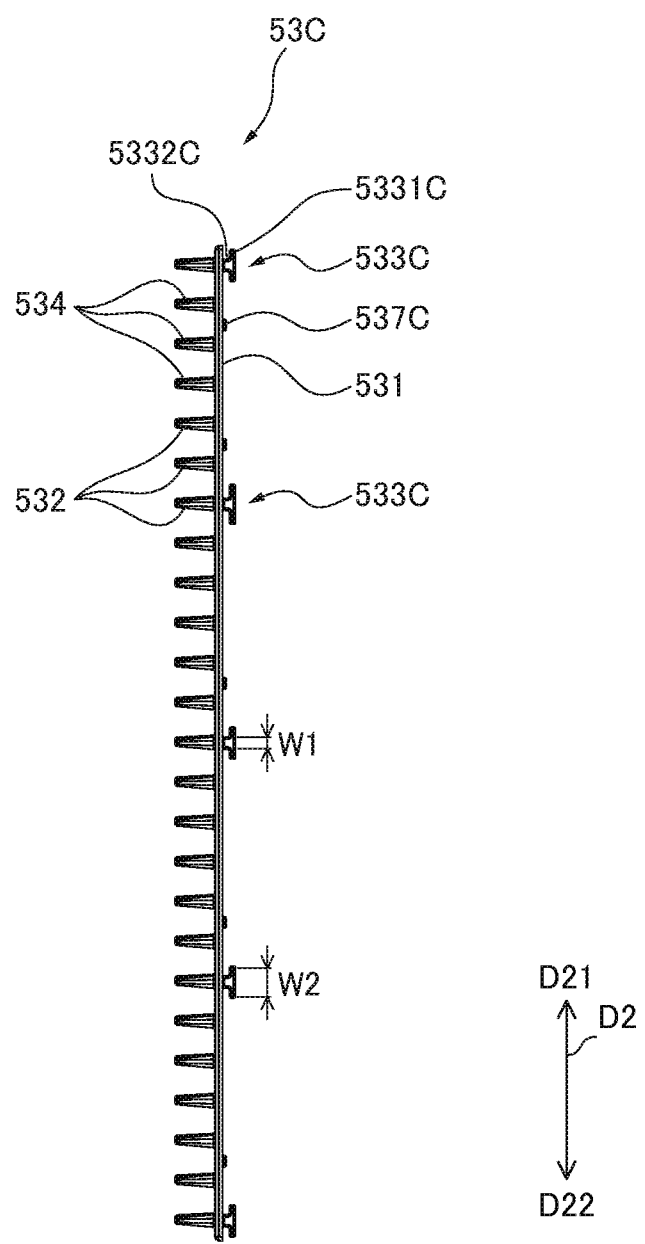
FIG. 15A is a side view illustrating the front side substrate contact portion 53C of the substrate storing container according to the fourth embodiment of the invention.
Figure 15B:
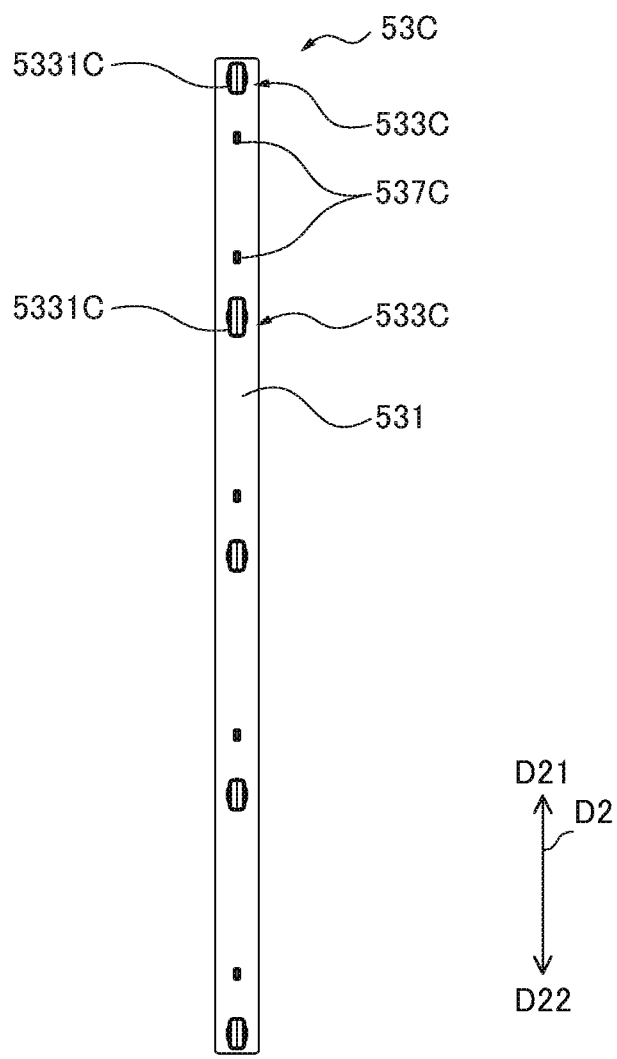
FIG. 15B is a rear view illustrating the front side substrate contact portion 53C of the substrate storing container according to the fourth embodiment of the invention.
Figure 15C:
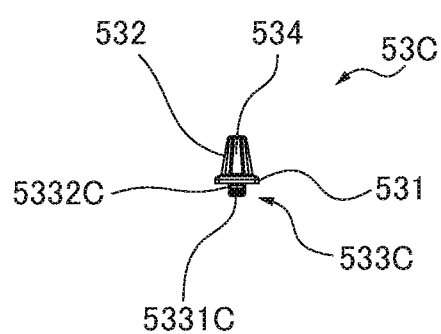
FIG. 15C is a plan view illustrating the front side substrate contact portion 53C of the substrate storing container according to the fourth embodiment of the invention.
Figure 16A:
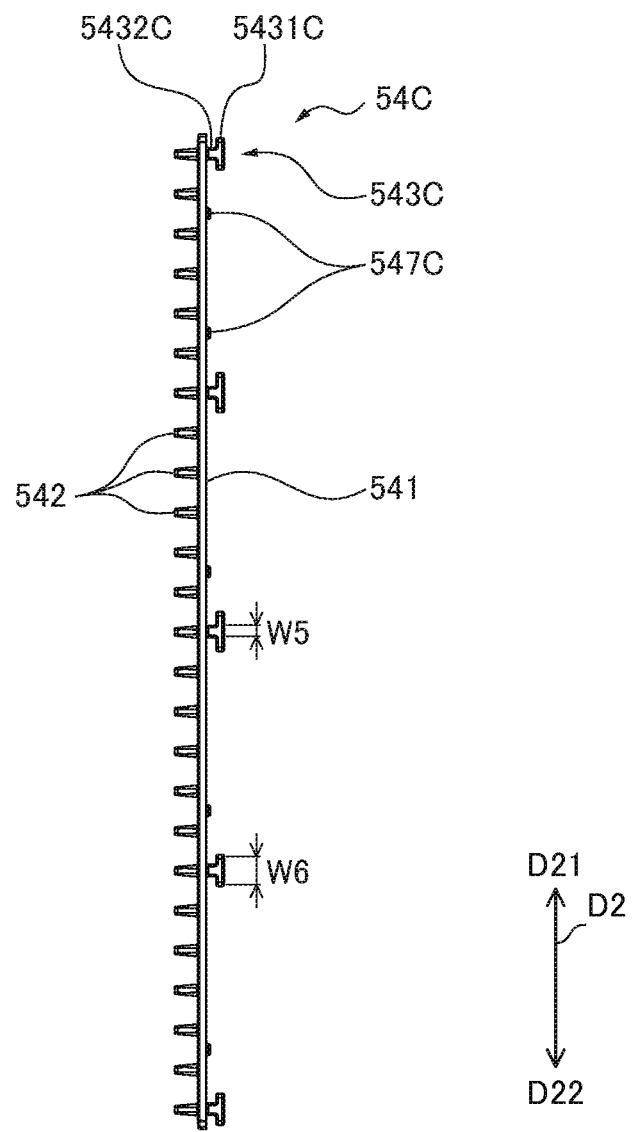
FIG. 16A is a side view illustrating the back side substrate contact portion 54C of the substrate storing container according to the fourth embodiment of the invention.
Figure 16B:
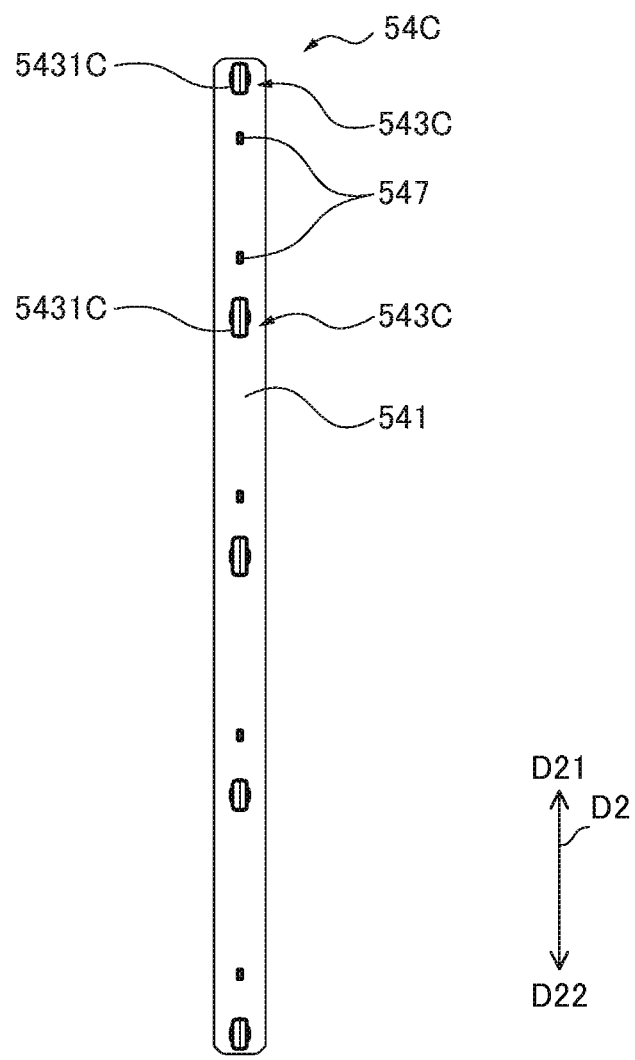
FIG. 16B is a rear view illustrating the back side substrate contact portion 54C of the substrate storing container according to the fourth embodiment of the invention.
Figure 16C:
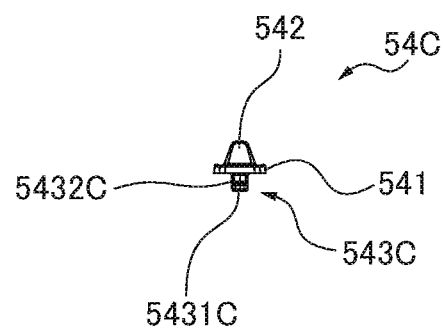
FIG. 16C is a plan view illustrating the back side substrate contact portion 54C of the substrate storing container according to the fourth embodiment of the invention.

FIG. 13 is a front view illustrating a substrate support plate-like portion 5C of the substrate storing container according to the fourth embodiment of the invention. FIG. 14 is a front view illustrating a state in which a front side substrate contact portion 53C and a back side substrate contact portion 54C are removed from the substrate support plate-like portion 5C of the substrate storing container according to the fourth embodiment of the invention. FIG. 15A is a side view illustrating the front side substrate contact portion 53C of the substrate storing container according to the fourth embodiment of the invention. FIG. 15B is a rear view illustrating the front side substrate contact portion 53C of the substrate storing container according to the fourth embodiment of the invention. FIG. 15C is a plan view illustrating the front side substrate contact portion 53C of the substrate storing container according to the fourth embodiment of the invention. FIG. 16A is a side view illustrating the back side substrate contact portion 54C of the substrate storing container according to the fourth embodiment of the invention. FIG. 16B is a rear view illustrating the back side substrate contact portion 54C of the substrate storing container according to the fourth embodiment of the invention. FIG. 16C is a plan view illustrating the back side substrate contact portion 54C of the substrate storing container according to the fourth embodiment of the invention.

Figure 17:
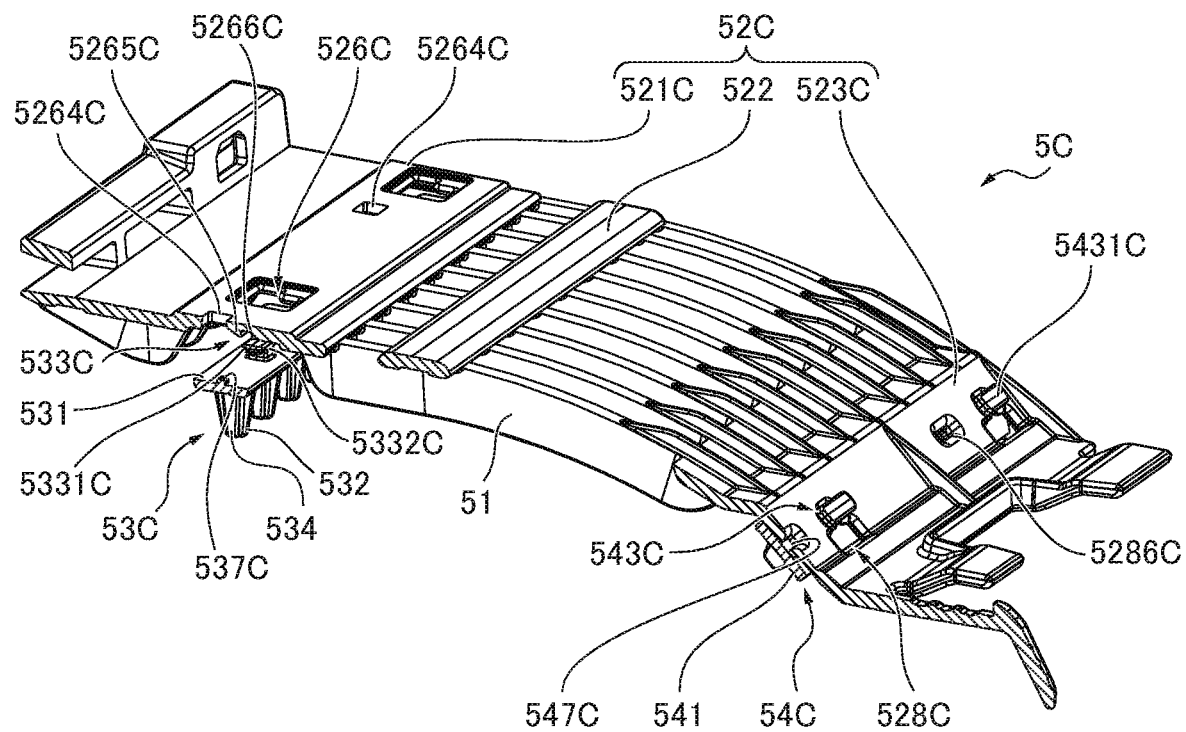
FIG. 17 is a cross-sectional perspective view illustrating a state in which the front side substrate contact portion 53C is to be attached to the substrate support plate-like portion 5C of the substrate storing container according to the fourth embodiment of the invention.
Figure 17:
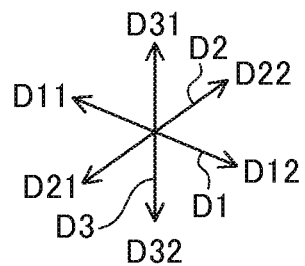
Figure 18:
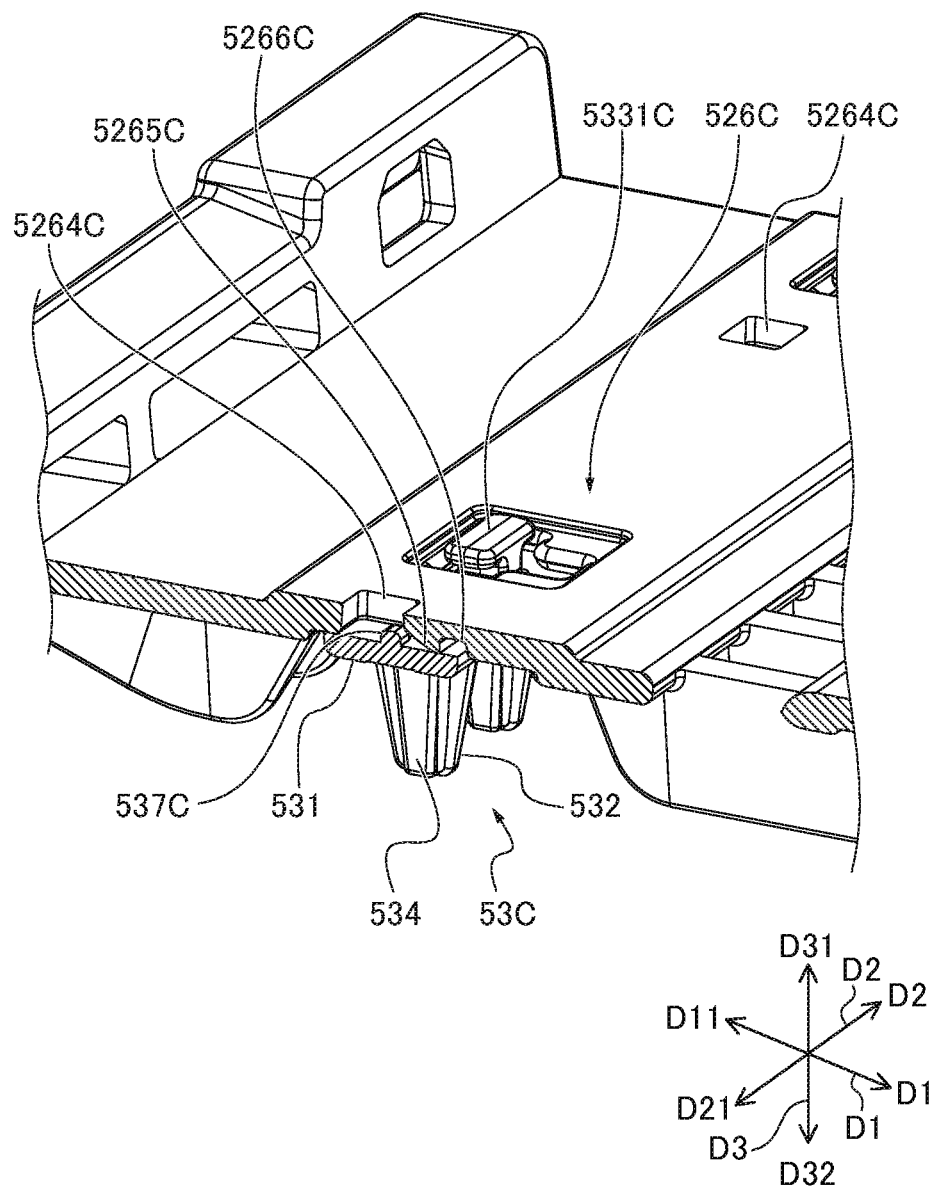
FIG. 18 is an enlarged cross-sectional perspective view illustrating a state in which a neck portion 5332C and a head portion 5331C of a locked portion of the front side substrate contact portion 53C are inserted into a wide hole portion 5261C of the substrate support plate-like portion 5C of the substrate storing container according to the fourth embodiment of the invention.
Figure 19:
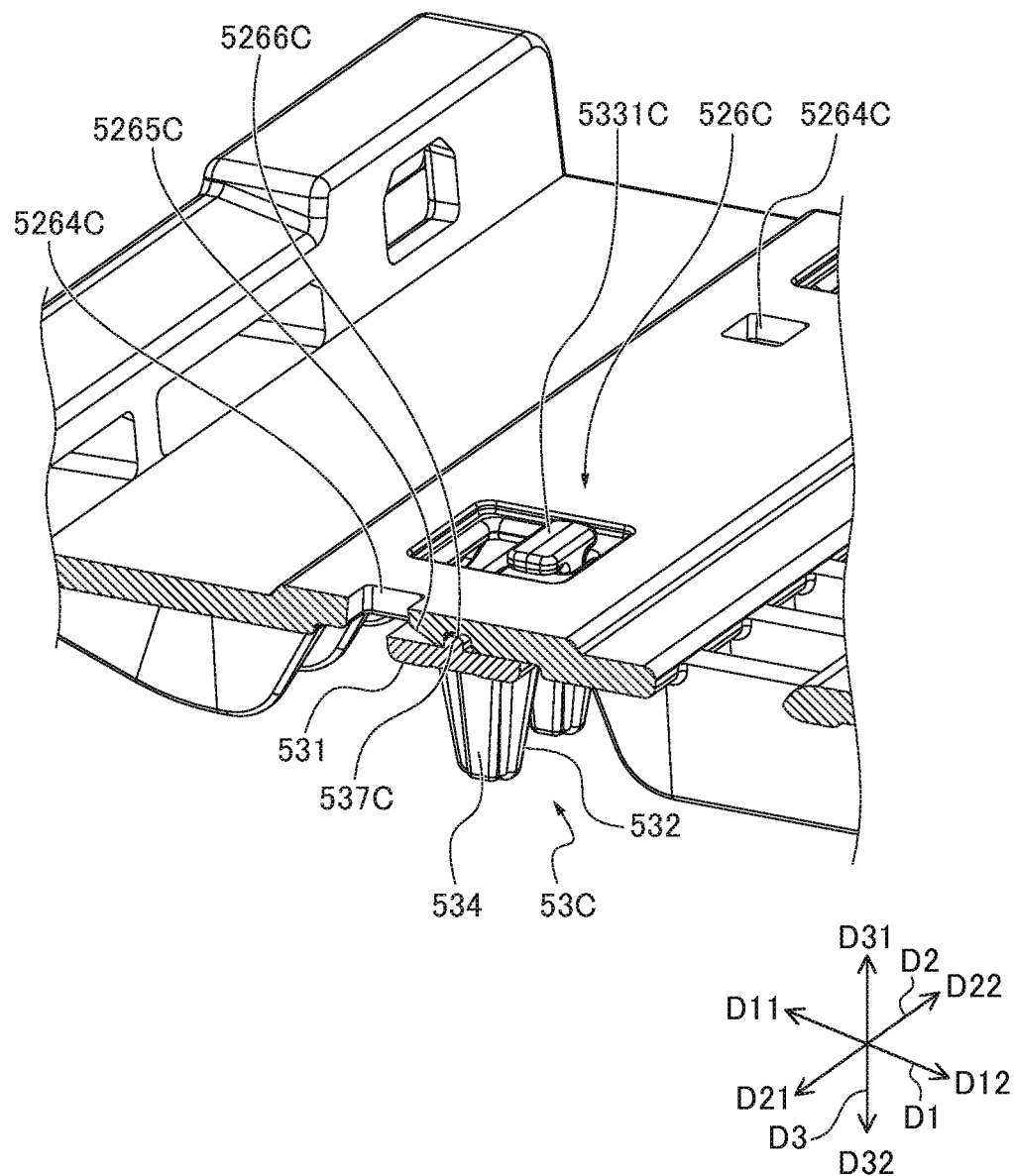
FIG. 19 is an enlarged cross-sectional perspective view illustrating a state in which the neck portion 5332C of the locked portion of the front side substrate contact portion 53C is inserted into a narrow hole portion 5262C of the substrate support plate-like portion 5C of the substrate storing container according to the fourth embodiment of the invention.

FIG. 17 is a cross-sectional perspective view illustrating a state in which the front side substrate contact portion 53C is to be attached to the substrate support plate-like portion 5C of the substrate storing container according to the fourth embodiment of the invention. FIG. 18 is an enlarged cross-sectional perspective view illustrating a state in which a neck portion 5332C and a head portion 5331C of a locked portion of the front side substrate contact portion 53C are inserted into a wide hole portion 5261C of the substrate support plate-like portion 5C of the substrate storing container according to the fourth embodiment of the invention. FIG. 19 is an enlarged cross-sectional perspective view illustrating a state in which the neck portion 5332C of the locked portion of the front side substrate contact portion 53C is inserted into a narrow hole portion 5262C of the substrate support plate-like portion 5C of the substrate storing container according to the fourth embodiment of the invention.

In the substrate storing container according to the fourth embodiment, configurations of the front side substrate contact portion 53C and the back side substrate contact portion 54C are different from configurations of the front side substrate contact portion 53 and the back side substrate contact portion 54 of the substrate storing container according to the first embodiment. In addition, as a result, configurations of a first plate portion support portion 521C and a third plate portion support portion 523C of the substrate storing container according to the fourth embodiment are different from configurations of the first plate portion support portion 521 and the third plate portion support portion 523 of the substrate storing container according to the first embodiment. Other configurations are the same as respective configurations in the first embodiment. The same reference symbols will be assigned to the same configurations in the first embodiment, and a description thereof will be omitted.

The substrate support plate-like portion 5C fixed to a first side wall 25 and the substrate support plate-like portion 5C fixed to a second side wall 26 have a bilaterally symmetric shape. For this reason, the substrate support plate-like portion 5C fixed to the first side wall 25 will be described, and a description of the substrate support plate-like portion 5C fixed to the second side wall 26 will be omitted.

The first plate portion support portion 521C includes a locking portion having a T-shaped through-hole 526C and a locked portion having a rectangular through-hole portion 5263C which is included in a locked portion movement inhibiting portion.

As illustrated in FIG. 14, five T-shaped through-holes 526C are formed at equal intervals in the upper/lower direction D2 from an upper end portion to a lower end portion of the first plate portion support portion 521C, and each of the T-shaped through-holes 526C has a rectangular wide hole portion 5261C and a rectangular narrow hole portion 5262C. The wide hole portion 5261C is positioned on a side in the forward direction D11 with respect to the narrow hole portion 5262C. A length of the wide hole portion 5261C in the upper/lower direction D2 is about twice a length of the narrow hole portion 5262C in the same direction. The narrow hole portion 5262C is in communication with a rear portion of a center position of the wide hole portion 5261C in the upper/lower direction D2.

The rectangular through-hole portion 5263C is formed around an upper portion or around a lower portion of the T-shaped through-hole 526C in the first plate portion support portion 521C. More specifically, a rectangular through-hole portion 5263C located at an uppermost position is formed around a lower portion of a T-shaped through-hole 526C located at an uppermost position. Rectangular through-hole portions 5263C located at second to fourth positions from above are formed around upper portions of T-shaped through-holes 526C located at second to fourth positions, respectively, from above.

The rectangular through-hole portion 5263C includes a through-hole 5264C, a protrusion 5265C, and a flat concave portion 5266C.

The through-hole 5264C is located at an endmost portion in the forward direction D11 in the rectangular through-hole portion 5263C, and penetrates the first plate portion support portion 521C. The flat concave portion 5266C is located at an endmost portion in the backward direction D12 in the rectangular through-hole portion 5263C, and has a concave portion recessed in the left direction D31 (direction from a front to a rear of the page in FIG. 14). The protrusion 5265C is positioned between the through-hole 5264C and the flat concave portion 5266C. The protrusion 5265C protrudes toward a center of the substrate storing space 27 (from the front toward the rear of the page in FIG. 14). A protrusion end face of the protrusion 5265C has an inclined surface directed in the left direction D31 as proceeding in the forward direction D11 (direction from the front to the rear of the page in FIG. 14) (refer to FIG. 17).

As illustrated in FIG. 14, the third plate portion support portion 523C includes a locking portion having a T-shaped through-hole 528C and a fixed portion having a rectangular through-hole portion 5283C included in a locked portion movement inhibiting portion.

Five T-shaped through-holes 528C are formed at equal intervals in the upper/lower direction D2 from an upper end portion to a lower end portion of the third plate portion support portion 523C, and each of the T-shaped through-holes 528C has a rectangular wide hole portion 5281C and a rectangular narrow hole portion 5282C. The wide hole portion 5281C is positioned on a side in the backward direction D12 with respect to the narrow hole portion 5282C. A length of the wide hole portion 5281C in the upper/lower direction D2 is about twice a length of the narrow hole portion 5282C in the same direction. The narrow hole portion 5282C is in communication with a front portion of a center position of the wide hole portion 5281C in the upper/lower direction D2.

The rectangular through-hole portion 5283C is formed around an upper portion or around a lower portion of the T-shaped through-hole 528C in the third plate portion support portion 523C. More specifically, a rectangular through-hole portion 5283C located at an uppermost position is formed around a lower portion of a T-shaped through-hole 528C located at an uppermost position. Rectangular through-hole portions 5283C located at second to fourth positions from above are formed around upper portions of T-shaped through-holes 528C located at second to fourth positions, respectively, from above.

The rectangular through-hole portion 5283C includes a through-hole 5284C, a protrusion 5285C, and a flat concave portion 5286C.

The through-hole 5284C is located at an endmost portion in the backward direction D12 in the rectangular through-hole portion 5283C, and penetrates the third plate portion support portion 523C. The flat concave portion 5286C is located at an endmost portion in the forward direction D11 in the rectangular through-hole portion 5283C, and has a concave portion recessed substantially in the left direction D31 (direction from the front to the rear of the page in FIG. 14). The protrusion 5285C is positioned between the through-hole 5284C and the flat concave portion 5286C. The protrusion 5285C protrudes toward a center of the substrate storing space 27 (from the front toward the rear of the page in FIG. 14). A protrusion end face of the protrusion 5285C has an inclined surface directed substantially in the left direction D31 as proceeding substantially in the backward direction D12.

The front side substrate contact portion 53C includes a front side fixed convex portion 533C serving as a locked portion and a movement inhibiting protrusion 537C included in the locked portion movement inhibiting portion.

As illustrated in FIG. 15A, FIG. 15B, FIG. 15C, and FIG. 17 to FIG. 19, the front side fixed convex portion 533C has a substantially T-shape protruding from a surface on the opposite side from a surface of a front side plate-shaped base portion 531 from which a front side inward convex portion 532 protrudes, and includes a head portion 5331C and a neck portion 5332C.

The head portion 5331C has a substantially rectangular plate shape included in a protrusion end portion of the front side fixed convex portion 533C. A longitudinal direction of the head portion 5331C has a positional relationship matching the upper/lower direction D2. The substantially rectangular plate-shaped head portion 5331C is configured to be smaller than the wide hole portion 5261C. In more detail, a width W2 of the head portion 5331C in the upper/lower direction D2 illustrated in FIG. 15A is shorter than a width W3 of the wide hole portion 5261C in the upper/lower direction D2 illustrated in FIG. 14, and the head portion 5331C is insertable into the wide hole portion 5261C. In addition, the head portion 5331C is configured to be larger than the narrow hole portion 5262C. In more detail, the width W2 of the head portion 5331C in the upper/lower direction D2 illustrated in FIG. 15A is longer than a width W4 of the narrow hole portion 5262C in the upper/lower direction D2 illustrated in FIG. 14, and the head portion 5331C is not insertable into the narrow hole portion 5262C.

One end portion of the neck portion 5332C is integrally molded with and connected to a center portion of the head portion 5331C in the upper/lower direction D2. The other end portion of the neck portion 5332C is integrally molded with and connected to the front side plate-shaped base portion 531 included in a main body of the substrate contact portion.

In four front side fixed convex portions 533C located at first, second, fourth, and fifth positions from below in FIG. 15A among five front side fixed convex portions 533C, a width W1 of the neck portion 5332C in a direction parallel to a surface of the front side plate-shaped base portion 531 corresponding to a direction orthogonal to a direction in which the narrow hole portion 5262C (refer to FIG. 14) and the wide hole portion 5261C are connected to each other (the upper/lower direction D2 corresponding to a direction parallel to a longitudinal direction of the wide hole portion 5261C) is configured to be smaller than the width W3 of the wide hole portion 5261C and the width W4 of the narrow hole portion 5262C in the same direction. For this reason, the neck portion 5332C is insertable into the wide hole portion 5261C and the narrow hole portion 5262C.

In one remaining front side fixed convex portion 533C, that is, a front side fixed convex portion 533C positioned at a center portion in the upper/lower direction D2 in FIG. 15A among the five front side fixed convex portions 533C, the width W1 of the neck portion 5332C in the same direction is substantially equal to the width W4 of the narrow hole portion 5262C (refer to FIG. 14) in the same direction. Herein, when the width W1 of the neck portion 5332C is completely equal to the width W4 of the narrow hole portion 5262C rather than being substantially equal thereto, the neck portion 5332C may not be inserted into the narrow hole portion 5262C. Thus, "the width W1 of the neck portion 5332C is substantially equal to the width W4 of the narrow hole portion 5262C" means that the width W4 of the narrow hole portion 5262C is equal to the width W1 of the neck portion 5332C to an extent at which such a defect is solved, and the neck portion 5332C is insertable into the narrow hole portion 5262C.

When the neck portion 5332C is inserted into the narrow hole portion 5262C by moving from the wide hole portion 5261C, and the head portion 5331C abuts a portion of the first plate portion support portion 521C around the narrow hole portion 5262C in the respective front side fixed convex portions 533C (refer to FIG. 15A, etc.) corresponding to all the five rectangular through-hole portions 5263C (refer to FIG. 14), the front side substrate contact portion 53C is fixed to the first plate portion support portion 521C of the plate portion support portion 52C.

As illustrated in FIG. 15A, similarly to the front side fixed convex portion 533C, the movement inhibiting protrusion 537C protrudes from the surface on the opposite side from the surface of the front side plate-shaped base portion 531 from which the front side inward convex portion 532 protrudes. The movement inhibiting protrusion 537C has a shape of a substantially rectangular parallelepiped having a size that allows insertion into the through-hole 5264C of the rectangular through-hole portion 5263C. The movement inhibiting protrusion 537C is integrally molded with and fixed to the front side plate-shaped base portion 531 to obtain a positional relationship in which all movement inhibiting protrusions 537C are inserted into through-holes 5264C of the rectangular through-hole portions 5263C one by one when head portions 5331C of all the front side fixed convex portions 533C are inserted into wide hole portions 5261C of the T-shaped through-holes 526C one by one. When the movement inhibiting protrusion 537C is moved from the through-hole 5264C and positioned at the flat concave portion 5266C by climbing over the protrusion 5265C, the neck portion 5332C is inserted into the narrow hole portion 5262C. In this state, the neck portion 5332C is inhibited from moving from the narrow hole portion 5262C to the wide hole portion 5261C, and the front side substrate contact portion 53C is inhibited from being removed from the first plate portion support portion 521C of the plate portion support portion 52C.

The back side substrate contact portion 54C includes a back side fixed convex portion 543C serving as a locked portion and a movement inhibiting protrusion 547C included in the locked portion movement inhibiting portion.

As illustrated in FIG. 16A, FIG. 16B, FIG. 16C, and FIG. 17 to FIG. 19, the back side fixed convex portion 543C has a substantially T-shape protruding from a surface on the opposite side from a surface of a back side plate-shaped base portion 541 from which a back side inward convex portion 542 protrudes, and includes a head portion 5431C and a neck portion 5432C.

The head portion 5431C has a substantially rectangular plate shape included in a protrusion end portion of the back side fixed convex portion 543C. A longitudinal direction of the head portion 5431C has a positional relationship matching the upper/lower direction D2. The substantially rectangular plate-shaped head portion 5431C is configured to be smaller than the wide hole portion 5281C. In more detail, a width W6 of the head portion 5431C in the upper/lower direction D2 illustrated in FIG. 16A is shorter than a width W7 of the wide hole portion 5281C in the upper/lower direction D2 illustrated in FIG. 14, and the head portion 5431C is insertable into the wide hole portion 5281C. In addition, the head portion 5431C is configured to be larger than the narrow hole portion 5282C. In more detail, the width W6 of the head portion 5431C in the upper/lower direction D2 illustrated in FIG. 16A is longer than a width W8 of the narrow hole portion 5282C in the upper/lower direction D2 illustrated in FIG. 14, and the head portion 5431C is not insertable into the narrow hole portion 5282C.

One end portion of the neck portion 5432C is integrally molded with and connected to a center portion of the head portion 5431C in the upper/lower direction D2. The other end portion of the neck portion 5432C is integrally molded with and connected to the back side plate-shaped base portion 541 included in the main body of the substrate contact portion.

In four back side fixed convex portions 543C located at first, second, fourth, and fifth positions from below in FIG. 16A among five back side fixed convex portions 543C, a width W5 of the neck portion 5432C in a direction parallel to a surface of the back side plate-shaped base portion 541 corresponding to a direction orthogonal to a direction in which the narrow hole portion 5282C and the wide hole portion 5281C are connected to each other (the upper/lower direction D2 corresponding to a direction parallel to a longitudinal direction of the wide hole portion 5281C) is configured to be smaller than the width W7 of the wide hole portion 5281C (refer to FIG. 14) and the width W8 of the narrow hole portion 5282C in the same direction. For this reason, the neck portion 5432C is insertable into the wide hole portion 5281C and the narrow hole portion 5282C.

In one remaining back side fixed convex portion 543C, that is, a back side fixed convex portion 543C positioned at a center portion in the upper/lower direction D2 in FIG. 16A among the five back side fixed convex portions 543C, the width W5 of the neck portion 5432C in the same direction is substantially equal to the width W8 of the narrow hole portion 5282C in the same direction. Herein, when the width W5 of the neck portion 5432C is completely equal to the width W8 of the narrow hole portion 5282C rather than being substantially equal thereto, the neck portion 5432C may not be inserted into the narrow hole portion 5282C. Thus, "the width W5 of the neck portion 5432C is substantially equal to the width W8 of the narrow hole portion 5282C" means that the width W8 of the narrow hole portion 5282C is equal to the width W5 of the neck portion 5432C to an extent at which such a defect is solved, and the neck portion 5432C is insertable into the narrow hole portion 5282C.

When the neck portion 5432C is inserted into the narrow hole portion 5282C by moving from the wide hole portion 5281C, and the head portion 5431C abuts a portion of the third plate portion support portion 523C around the narrow hole portion 5282C in the respective back side fixed convex portions 543C (refer to FIG. 16A, etc.) corresponding to all the five rectangular through-hole portions 5283C (refer to FIG. 14), the back side substrate contact portion 54C is fixed to the third plate portion support portion 523C of the plate portion support portion 52C.

As illustrated in FIG. 16A, similarly to the back side fixed convex portion 543C, the movement inhibiting protrusion 547C protrudes from the surface on the opposite side from the surface of the back side plate-shaped base portion 541 from which the back side inward convex portion 542 protrudes. The movement inhibiting protrusion 547C has a shape of a substantially rectangular parallelepiped having a size that allows insertion into the through-hole 5284C of the rectangular through-hole portion 5283C. The movement inhibiting protrusion 547C is integrally molded with and fixed to the back side plate-shaped base portion 541 to obtain a positional relationship in which all movement inhibiting protrusions 547C are inserted into through-holes 5284C of the rectangular through-hole portions 5283C one by one when head portions 5431C of all the back side fixed convex portions 543C are inserted into wide hole portions 5281C of the T-shaped through-holes 528C one by one. When the movement inhibiting protrusion 547C is moved from the through-hole 5284C and positioned at the flat concave portion 5286C by climbing over the protrusion 5285C, the neck portion 5432C is inserted into the narrow hole portion 5282C. In this state, the neck portion 5432C is inhibited from moving from the narrow hole portion 5282C to the wide hole portion 5281C, and the back side substrate contact portion 54C is inhibited from being removed from the third plate portion support portion 523C of the plate portion support portion 52C.

Next, a description will be given of an operation of fixing the front side substrate contact portion 53C to the first plate portion support portion 521C. An operation of fixing the back side substrate contact portion 54C to the third plate portion support portion 523C is similar to the operation of fixing the front side substrate contact portion 53C to the first plate portion support portion 521C, and thus a description thereof will be omitted.

First, as illustrated in FIG. 17, the front side plate-shaped base portion 531 is disposed to face the front side contact portion contact face 525 such that the head portions 5331C of all the front side fixed convex portions 533C face the wide hole portions 5261C of all the T-shaped through-holes 526C (refer to FIG. 14) in a state in which the head portions 5331C are insertable into the wide hole portions 5261C. In this way, all the movement inhibiting protrusions 537C face the through-holes 5264C of all the rectangular through-hole portions 5263C.

Subsequently, the front side plate-shaped base portion 531 is moved to approach the first plate portion support portion 521C. Then, as illustrated in FIG. 18, the head portions 5331C of all the front side fixed convex portions 533C are inserted into the wide hole portions 5261C of all the T-shaped through-holes 526C.

Subsequently, the front side plate-shaped base portion 531 is moved in the backward direction D12 (the right direction of FIG. 18) with respect to the front side contact portion contact face 525. Then, the movement inhibiting protrusion 537C moves on the inclined surface of the protrusion 5265C, and approaches the flat concave portion 5266C. In addition, the neck portion 5332C moves from the wide hole portion 5261C to the narrow hole portion 5262C.

Then, when the front side plate-shaped base portion 531 is further moved in the backward direction D12 (the right direction of FIG. 18) with respect to the front side contact portion contact face 525, the movement inhibiting protrusion 537C climbs over the inclined surface of the protrusion 5265C and falls to the flat concave portion 5266C from the inclined surface as illustrated in FIG. 19. In this instance, the neck portion 5332C is positioned at the narrow hole portion 5262C. In this way, the movement inhibiting protrusion 537C is positioned at the flat concave portion 5266C, and movement from the flat concave portion 5266C to the through-hole 5264C is inhibited due to the presence of the protrusion 5265C. For this reason, the neck portion 5332C is in a state in which movement from the narrow hole portion 5262C to the wide hole portion 5261C is inhibited. In this state, the head portion 5331C is not removed from the narrow hole portion 5262C, and thus a state in which the front side substrate contact portion 53C is fixed to the first plate portion support portion 521C of the plate portion support portion 52C is maintained.

The following effect can be obtained in accordance with the substrate storing container according to the fourth embodiment with the abovementioned configuration.

As described in the foregoing, the first plate portion support portion 521C and the third plate portion support portion 523C serving as a contact portion support portion have the T-shaped through-holes 526C and 528C serving as locking portions. The wide hole portions 5261C and 5281C and the narrow hole portions 5262C and 5282C in communication with the wide hole portions are formed in the locking portions. The substrate contact portions have the front side plate-shaped base portion 531 and the back side plate-shaped base portion 541 serving as the main body of the substrate contact portion, and the front side fixed convex portion 533C and the back side fixed convex portion 543C serving as the locked portions locked in the locking portions. The main body of the substrate contact portion may not be inserted into the wide hole portion and the narrow hole portion. The locked portions include the head portions 5331C and 5431C insertable into the wide hole portions and not insertable into the narrow hole portions, and the neck portions 5332C and 5432C, one end portions of which are connected to the head portions and the other end portions of which are connected to the main body of the substrate contact portion, insertable into the wide hole portions and the narrow hole portions. The rectangular through-hole portions 5263C and 5283C and the movement inhibiting protrusions 537C and 547C are included as the locked portion movement inhibiting portions that inhibit the neck portions from moving from the narrow hole portions to the wide hole portions when the neck portions are inserted into the narrow hole portions.

According to this configuration, the front side substrate contact portion 53C and the back side substrate contact portion 54C may be easily fixed to the first plate portion support portion 521C and the third plate portion support portion 523C, respectively. Further, it is possible to maintain a state in which the front side substrate contact portion 53C and the back side substrate contact portion 54C are fixed to the first plate portion support portion 521C and the third plate portion support portion 523C, respectively.

In addition, a plurality of locking portions and a plurality of locked portions are present. In one of the narrow hole portions, the widths W4 and W8 of the narrow hole portion are substantially equal to the widths W1 and W5 of the neck portions 5332C and 5432C in the direction D2 orthogonal to a direction in which the narrow hole portion and the wide hole portion are connected to each other. In another one of the narrow hole portions, the widths W4 and W8 of the narrow hole portion are larger than the widths W1 and W5 of the neck portions 5332C and 5432C in the direction D2 orthogonal to a direction in which the narrow hole portion and the wide hole portion are connected to each other.

According to this configuration, even when a slight dimensional error is generated in the front side substrate contact portion 53C and the back side substrate contact portion 54C, it is possible to lock all the front side fixed convex portions 533C and the back side fixed convex portions 543C in all the T-shaped through-holes 526C and 528C, and to prevent a state in which locking is not allowed due to the dimensional error. For this reason, the front side substrate contact portion 53C and the back side substrate contact portion 54C may be fixed to the first plate portion support portion 521C and the third plate portion support portion 523C, respectively, irrespective of the dimensional error.

Further, in the narrow hole portions of the T-shaped through-holes 526C and 528C at center portions corresponding to one of the narrow hole portions, the widths W4 and W8 of the narrow hole portion are substantially equal to the widths W1 and W5 of the neck portions 5332C and 5432C in the upper/lower direction D2 orthogonal to the direction in which the narrow hole portion and the wide hole portion are connected to each other. Thus, the front side substrate contact portion 53C and the back side substrate contact portion 54C may be fixed to the first plate portion support portion 521C and the third plate portion support portion 523C, respectively, in a state in which the front side fixed convex portion 533C and the back side fixed convex portion 543C are accurately positioned to the T-shaped through-holes 526C and 528C at the center portions.

Hereinafter, a description will be given of a substrate storing container according to a fifth embodiment of the invention with reference to FIG. 20.

Figure 20:
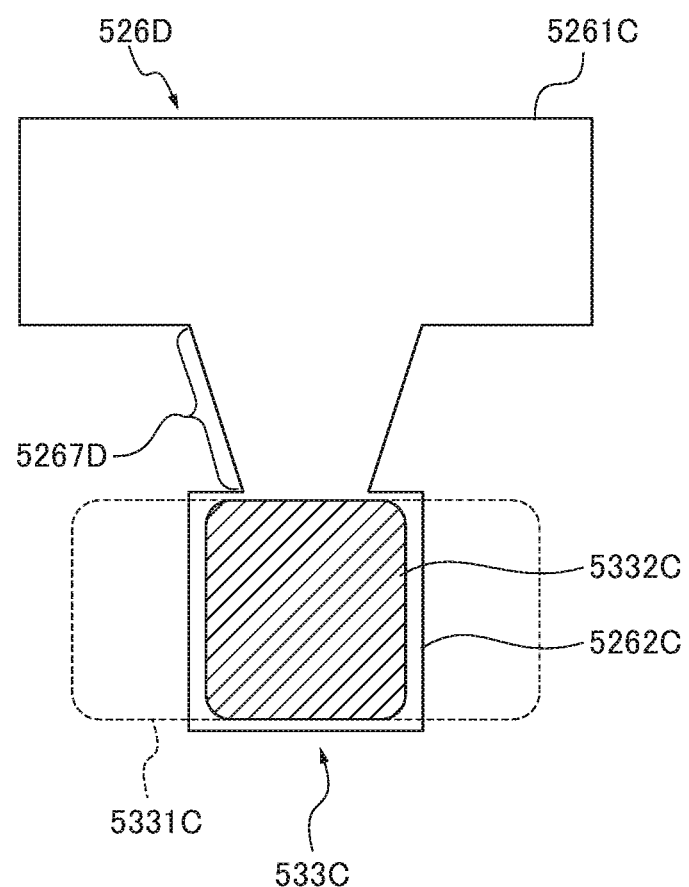
FIG. 20 is a schematic cross-sectional view illustrating a state in which a neck portion 5332C of a locked portion of a front side substrate contact portion 53C is inserted into a narrow hole portion 5262C of a substrate support plate-like portion of a substrate storing container according to a fifth embodiment of the invention.

FIG. 20 is a schematic cross-sectional view illustrating a state in which a neck portion 5332C of a locked portion of a front side substrate contact portion 53C is inserted into a narrow hole portion 5262C of a substrate support plate-like portion of the substrate storing container according to the fifth embodiment of the invention.

In the substrate storing container according to the fifth embodiment, a shape of a T-shaped through-hole 526D is different from a shape of the T-shaped through-hole 526C according to the fourth embodiment. Other configurations are similar to respective configurations in the fourth embodiment. The same reference symbols will be assigned to the same configurations as those in the fourth embodiment, and a description thereof will be omitted.

In addition, the T-shaped through-hole 526D into which a front side fixed convex portion 533C is inserted and a T-shaped through-hole (not illustrated) into which a back side fixed convex portion 543C is inserted have the same shape. Thus, only the T-shaped through-hole 526D into which the front side fixed convex portion 533C is inserted will be described, and a description of the T-shaped through-hole (not illustrated) into which the back side fixed convex portion 543C is inserted will be omitted.

The T-shaped through-hole 526D has a tapered hole portion 5267D. One end portion of the tapered hole portion 5267D is connected to a center portion of a wide hole portion 5261C in a longitudinal direction. The other end portion of the tapered hole portion 5267D is connected to a center portion of a narrow hole portion 5262C facing the wide hole portion 5261C. In this way, the tapered hole portion 5267D allows communication between the wide hole portion 5261C and the narrow hole portion 5262C.

The tapered hole portion 5267D has a tapered shape from the wide hole portion 5261C toward the narrow hole portion 5262C. In addition, an opening width of a portion of the tapered hole portion 5267D connected to the narrow hole portion 5262C is shorter than the width W1 (refer to FIG. 15A) of the neck portion 5332C in the upper/lower direction D2. For this reason, the neck portion 5332C passing through the tapered hole portion 5267D from the wide hole portion 5261C enters the narrow hole portion 5262C by being pushed in a direction toward the narrow hole portion 5262C. After the neck portion 5332C enters the narrow hole portion 5262C, the neck portion 5332C is inhibited from moving from the narrow hole portion 5262C to the wide hole portion 5261C by a tapered portion of the tapered hole portion 5267D.

The following effect can be obtained in accordance with the substrate storing container according to the fifth embodiment with the abovementioned configuration.

As described in the foregoing, the T-shaped through-hole 526D includes the tapered hole portion 5267D that allows communication between the wide hole portion 5261C and the narrow hole portion 5262C. For this reason, the movement inhibiting protrusions 537C and 547C or the rectangular through-hole portions 5263C and 5283C in the fourth embodiment may not be used, and the locked portion movement inhibiting portion may be configured by the tapered hole portion 5267D. As a result, a front side substrate contact portion having a front side inward convex portion 532 and a back side substrate contact portion having a back side inward convex portion 542 may be fixed to a contact portion support portion of a lateral substrate support portion using a simple configuration.

The invention is not restricted to the above-described embodiments, and may be modified in a technical scope described in claims. For example, in the present embodiment, the container main body 2 and the first plate portion support portion 521, the third plate portion support portion 523, and the plate portion 51B included in the contact portion support portion are configured as separate bodies, that is, separate components. However, the invention is not restricted to this configuration. For example, the substrate support plate-like portion 5 in which the front side substrate contact portion 53 and the back side substrate contact portion 54 serving as a contact portion support portion illustrated in FIG. 4 are not provided may be molded integrally with the container main body 2 illustrated in FIG. 1.

In addition, in the present embodiment, the front side fixed convex portion 533C and the back side fixed convex portion 543C are present on sides of the front side substrate contact portion 53C and the back side substrate contact portion 54C, and the T-shaped through-holes 526C and 528C are formed on sides of the first plate portion support portion 521C and the third plate portion support portion 523C. However, the invention is not restricted to this configuration. For example, protrusions may be present on the sides of the front side substrate contact portion 53C and the back side substrate contact portion 54C, and through-holes may be formed on the sides of the first plate portion support portion 521C and the third plate portion support portion 523C.

Similarly, in the present embodiment, the movement inhibiting protrusion 537C and the movement inhibiting protrusion 547C are present on sides of the front side substrate contact portion 53C and the back side substrate contact portion 54C, and the rectangular through-hole portion 5263C is formed on a side of the first plate portion support portion 521C and the third plate portion support portion 523C. However, the invention is not restricted to this configuration. For example, protrusions may be present on the sides of the first plate portion support portion 521C and the third plate portion support portion 523C, and through-holes may be formed on the sides of the front side substrate contact portion 53C and the back side substrate contact portion 54C. In addition, configurations of the locking portion, the locked portion, and the locked portion movement inhibiting portion are not restricted to configurations of the locking portion, the locked portion, and the locked portion movement inhibiting portion in the present embodiment.

In addition, shapes, dimensions, and materials of the container main body, the lid body, and the lateral substrate support portion, the number of substrates that can be stored in the container main body, etc. are not restricted to shapes, dimensions, and materials of the container main body 2, the lid body 3, and the substrate support plate-like portion 5, the number of substrates W that can be stored in the container main body 2, etc. in the present embodiment. For example, the front side substrate contact portions 53 and 53A and the back side substrate contact portions 54 and 54A may have a divided configuration such as a two-division configuration, a three-division configuration, etc., or have a configuration in which the same number of portions as the number of substrates W are separately provided one by one for each one of the substrates W. In addition, for example, the diameter of the substrate W is 300 mm. However, the diameter is not restricted to this value. For example, the diameter of the substrate W may be in a range of 300 mm to 450 mm. In addition, for example, a pair of substrate support plate-like portions 5 is provided. However, the invention is not restricted thereto. At least a pair of substrate support plate-like portions 5 may be provided.

EXPLANATION OF REFERENCE NUMERALS 1 substrate storing container
2 container main body
3 lid body
5, 5A substrate support plate-like portion (lateral substrate support portion)

21 container main body opening portion
27 substrate storing space
51B plate portion (contact portion support portion)
53, 53A front side substrate contact portion (substrate contact portion)
54, 54A back side substrate contact portion (substrate contact portion)
521, 521A, 521C first plate portion support portion (contact portion support portion)
523, 523A, 523C third plate portion support portion (contact portion support portion)
531 front side plate-shaped base portion
541 back side plate-shaped base portion
534B substantially semi-circular convex member (contact portion support portion)
544B plate-shaped inclined convex member (contact portion support portion)
526C, 526D, 528C T-shaped through-hole (locking portion)
5261C, 5281C wide hole portion
5262C, 5282C narrow hole portion
5267D tapered hole portion (locking portion)
533C front side fixed convex portion (locked portion)
537C movement inhibiting protrusion (locked portion movement inhibiting portion)
543C back side fixed convex portion (locked portion)
5263C, 5283C rectangular through-hole portion (locked portion movement inhibiting portion)
5331C, 5431C head portion
5332C, 5432C neck portion
W substrate

The invention claimed is:

1. A substrate storing container comprising:
a container main body in which a substrate storing space capable of storing a plurality of substrates is formed therein, and a container main body opening portion in communication with the substrate storing space is formed at one end portion;
a lid body removably attached to the container main body opening portion, the lid body removably capable of closing the container main body opening portion; and
lateral substrate support portions disposed to form a pair of the lateral substrate support portions in the substrate storing space, the lateral substrate support portions being capable of supporting edge portions of the plurality of substrates in a state in which adjacent substrates among the plurality of substrates are arranged in parallel to be spaced by a predetermined interval when the container main body opening portion is not closed by the lid body,
wherein each of the lateral substrate support portions includes a substrate contact portion that touches the substrates when the edge portions of the substrates are supported, and a contact portion support portion that supports the substrate contact portion,
the contact portion support portion is made of a cycloolefin polymer or a cycloolefin copolymer, and has a heat-resisting property for preventing the substrate storing container from changing in dimension due to heat strain, whereby preventing the substrates from being damaged due to contact with a substrate ejector,
the substrate contact portion is made of a material having a heat-resisting property with respect to temperature of the substrates touching the substrate contact portion, and
the contact portion support portion is made of a material having a lower heat-resisting property than a heat-resisting property of the substrate contact portion and having a lower coefficient of moisture absorption than a coefficient of moisture absorption of the substrate contact portion,
the substrate contact portion comprises a plurality of front side inward convex portions and one plate-shaped base portion, and in the substrate contact portion, all of the front side inward convex portions are molded integrally with the one plate-shaped base portion.

2. The substrate storing container according to claim 1, wherein the substrate contact portion is formed to be separated from the contact portion support portion and fixed to the contact portion support portion.

3. The substrate storing container according to claim 1, wherein the container main body has a pair of side walls,
at least one of the pair of the lateral substrate support portions is provided, one of the lateral substrate support portions is fixed to one of the side walls, and the other one of the lateral substrate support portions is fixed to the other one of the side walls,
the one of the lateral substrate support portions is allowed to be fixed to the other one of the side walls, and the other one of the lateral substrate support portions is allowed to be fixed to the one of the side walls, and
the substrate contact portion of the one of the lateral substrate support portions is allowed to be fixed to the contact portion support portion of the other one of the lateral substrate support portions, and the substrate contact portion of the other one of the lateral substrate support portions is allowed to be fixed to the contact portion support portion of the one of the lateral substrate support portions.

4. The substrate storing container according to claim 2,
wherein the contact portion support portion has a locking portion,
a wide hole portion and a narrow hole portion in communication with the wide hole portion are formed in the locking portion,
the substrate contact portion includes a main body of the substrate contact portion and a locked portion locked in the locking portion,
the main body of the substrate contact portion is not insertable into the wide hole portion and the narrow hole portion,
the locked portion includes a head portion insertable into the wide hole portion and not insertable into the narrow hole portion, and a neck portion insertable into the wide hole portion and the narrow hole portion, one end portion of the neck portion being connected to the head portion, an other end portion of the neck portion being connected to the main body of the substrate contact portion, and
a locked portion movement inhibiting portion is included to inhibit the neck portion from moving from the narrow hole portion to the wide hole portion when the neck portion is inserted into the narrow hole portion.

5. The substrate storing container according to claim 4,
wherein a plurality of the locking portion and a plurality of the locked portion are included,
a width of the narrow hole portion is substantially equal to a width of the neck portion in a direction orthogonal to a direction in which the narrow hole portion and the wide hole portion are connected to each other in one of the narrow hole portions, and a width of the narrow hole portion is larger than a width of the neck portion in the direction orthogonal to the direction in which the narrow hole portion and the wide hole portion are connected to each other in another one of the narrow hole portions.

6. The substrate storing container according to claim 1, wherein the substrate contact portion is fixed to the contact portion support portion using insert molding.

7. The substrate storing container according to claim 1, wherein the substrate contact portion is formed by overmolding with respect to the contact portion support portion.

8. The substrate storing container according to claim 1, wherein the container main body is made of a material having a lower coefficient of moisture absorption than a coefficient of moisture absorption of the substrate contact portion.

9. The substrate storing container according to claim 1, wherein the container main body is molded integrally with the contact portion support portion.

10. The substrate storing container according to claim 1, wherein the substrate contact portion can be removably attached to the contact portion support portion, the lateral substrate support portions including the substrate contact portion and the contact portion support portion is fixed to the container main body.

* * * * *